United States Patent
Sakai et al.

(10) Patent No.: US 6,388,279 B1
(45) Date of Patent: May 14, 2002

(54) SEMICONDUCTOR SUBSTRATE MANUFACTURING METHOD, SEMICONDUCTOR PRESSURE SENSOR AND MANUFACTURING METHOD THEREOF

(75) Inventors: Minekazu Sakai, Kariya; Toshimasa Yamamoto, Ama-gun; Yasutoshi Suzuki, Okazaki; Kenichi Yokoyama, Nagoya; Masakazu Terada, Chiryu; Eishi Kawasaki, Kuwana; Inao Toyoda, Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/095,131

(22) Filed: Jun. 10, 1998

(30) Foreign Application Priority Data

Jun. 11, 1997 (JP) .......................... H.9-153746
Nov. 21, 1997 (JP) .......................... H.9-321022
Apr. 28, 1998 (JP) ........................ H.10-119089

(51) Int. Cl.$^7$ ............................................. H01L 27/20
(52) U.S. Cl. ...................... 257/254; 257/253; 257/254; 257/415; 257/417; 438/50; 438/53
(58) Field of Search ................................ 257/253, 254, 257/415, 417; 438/50, 53

(56) References Cited

U.S. PATENT DOCUMENTS

| | | | |
|---|---|---|---|
| 4,906,586 A | * 3/1990 | Blackburn | .................... 437/40 |
| 4,975,390 A | 12/1990 | Fujii et al. | |
| 5,242,863 A | * 9/1993 | Xiang-Zheng et al. | ....... 437/228 |
| 5,335,550 A | 8/1994 | Satou | |
| 6,028,343 A | * 2/2000 | Chan et al. | .................. 257/417 |
| 6,051,853 A | * 4/2000 | Shimada et al. | ............ 257/252 |

FOREIGN PATENT DOCUMENTS

| | | | |
|---|---|---|---|
| JP | 63-175482 | 7/1988 | |
| JP | 1-239881 | 9/1989 | |
| JP | 2-30188 | 1/1990 | |
| JP | 2-254764 | 10/1990 | |
| JP | 3-68175 | 3/1991 | |
| JP | 4-181136 | 6/1992 | |
| JP | 362259476 | * 7/1992 | .................. 257/254 |
| JP | 404206663 | * 7/1992 | .................. 257/254 |
| JP | 5-18837 | 1/1993 | |
| JP | 5-226674 | 9/1993 | |
| JP | 8-236788 | 9/1996 | |

OTHER PUBLICATIONS

Parameswaran, et al., "Silicon Pressure Sensors Using a Wafer–Bonded Sealed Cavity Process", Transducers '95. Eurosensors 1X, Jun. 25–29, 1995, pp. 582–585, Massachusetts Institute of Technology.

* cited by examiner

*Primary Examiner*—Eddie Lee
*Assistant Examiner*—Edgardo Ortiz
(74) *Attorney, Agent, or Firm*—Harness, Dickey & Pierce, PLC

(57) ABSTRACT

In the method for manufacturing a semiconductor substrate, a concavity and a connecting hole for connecting the concavity to the outside are formed on a lower face side of a first substrate, and the first substrate is laminated with a second substrate in an atmosphere at atmospheric pressure. A diaphragm is formed by thinning the first substrate from its upper face by polishing. A sealing hole reaching to the connecting hole is formed from the upper face of the first substrate. An oxide film is formed in the sealing hole in a vacuum, whereby the connecting hole is sealed while the pressure of the pressure reference chamber is reduced to a vacuum. In this way, since the pressure reference chamber is pressure-reduced in a final stage, the diaphragm can be prevented from deforming due to pressure difference during polishing.

8 Claims, 18 Drawing Sheets

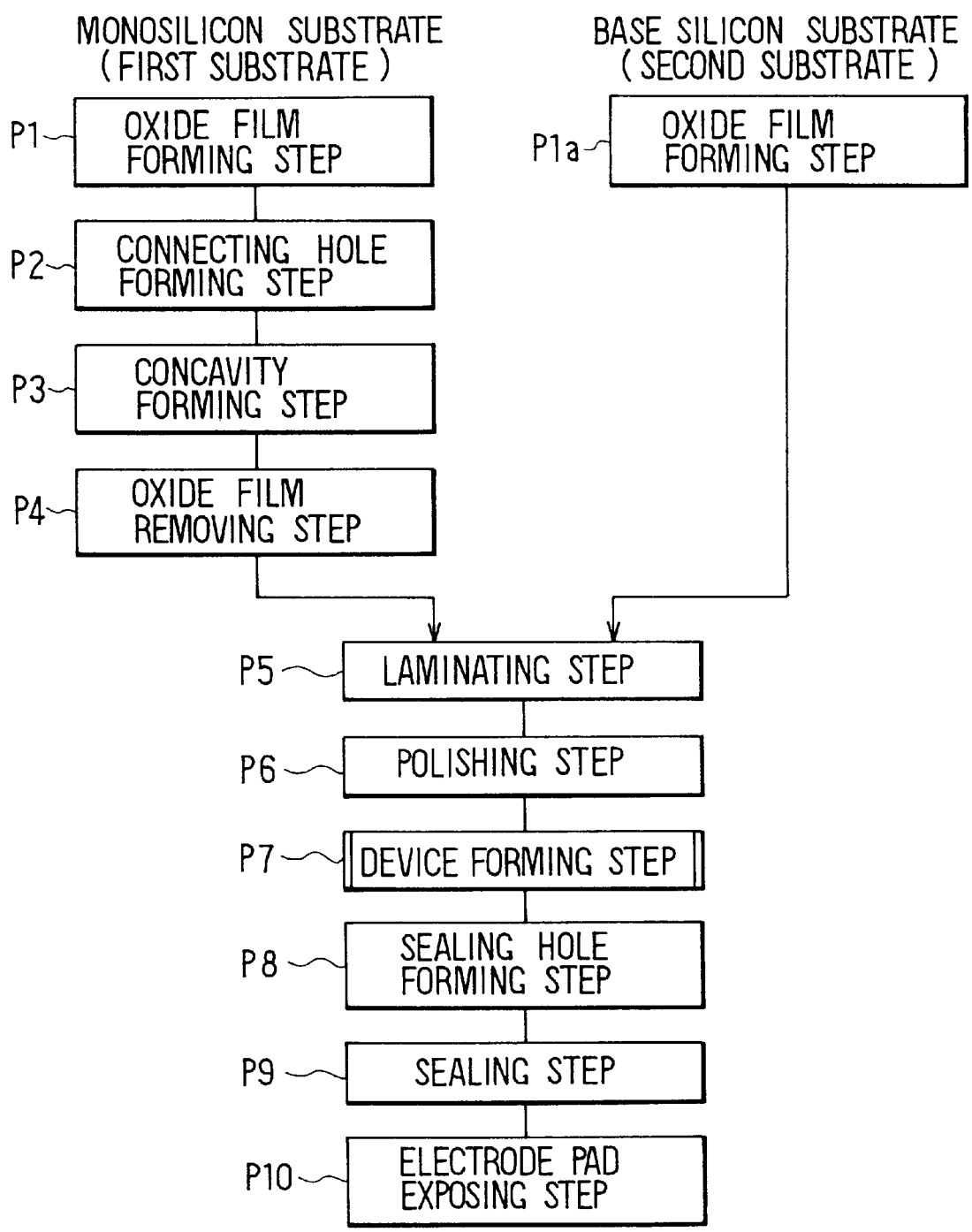

SEMICONDUCTOR SUBSTRATE MANUFACTURING METHOD, SEMICONDUCTOR PRESSURE SENSOR AND MANUFACTURING METHOD THEREOF

CROSS REFERENCE TO RELATED APPLICATION

This application is based upon and claims the benefit of priority of Japanese Patent Applications No. H.9-153746 filed on Jun. 11, 1997, No. H.9-321022 filed on Nov. 21, 1997 and No. H.10-119089 filed on Apr. 28, 1998, the contents of which are incorporated herein by reference.

BACKGROUND OF THE INVENTION

1. Field of the Invention

This invention relates to a method for manufacturing a semiconductor substrate having a pressure reference chamber therein, used for a pressure sensor or the like and relates to a semiconductor pressure sensor and a manufacturing method thereof.

2. Related Art

Semiconductor pressure sensors for detecting the pressure acting on a diaphragm include those constructed with a pressure reference chamber provided thereinside. In this case, in order to maximize the detecting accuracy of the sensor, the amount of gas remaining inside the pressure reference chamber is made as small as possible to reduce fluctuations of the reference pressure inside the pressure reference chamber resulting from temperature variations.

As semiconductor substrates used in the manufacture of this kind of semiconductor pressure sensor, substrates wherein a part corresponding to a pressure reference chamber is formed in advance have been used. This kind of semiconductor substrate is made for example by laminating together two silicon substrates so as to form a pressure reference chamber thereinside, as shown in FIGS. 23A through 23C.

That is, first, as shown in FIG. 23A, a concavity 2 used as a pressure reference chamber is formed in a first silicon substrate 1 by a method such as etching. Also, an oxide film 4 is formed on the surface of a second silicon substrate 3. Then, the first silicon substrate 1 and the second silicon substrate 3 are laminated together so that the concavity 2 in the first silicon substrate 1 is covered by the face of the second silicon substrate 3 on which the oxide film 4 is formed. This lamination is carried out in a vacuum. As a result, in the laminated state, the concavity 2 is covered by the second silicon substrate 3 and forms a pressure reference chamber 5 containing a vacuum (see FIG. 23B).

Then, by polishing the exposed face of the first silicon substrate 1, the thickness of the bottom part of the pressure reference chamber 5 is brought to a predetermined thickness to form a part to become a diaphragm 6. After that, a plurality of resistors having a piezoresistance effect are formed in the diaphragm 6 and these are connected in the form of a bridge circuit to complete a semiconductor pressure sensor.

When the pressure of an environment in which the semiconductor pressure sensor has been placed acts on the diaphragm 6, the diaphragm 6 is displaced by a force corresponding to the difference between this pressure and the pressure inside the pressure reference chamber 5. In correspondence with this displacement of the diaphragm 6, the resistances of the resistors are changed by a piezoresistance effect. At this time, a voltage corresponding to the pressure of the environment is outputted to output terminals of the bridge circuit, and by detecting this output voltage it is possible to detect the pressure.

However, this kind of semiconductor pressure sensor detects the pressure acting on the diaphragm 6 as a change in the resistances of resistors changing in correspondence with the displacement of the diaphragm 6. Consequently, the thickness dimension of the diaphragm 6 is a factor determining the precision of the pressure detection. That is, if the diaphragm 6 is made thin, the detection precision can be increased correspondingly. And, to reduce the area of the diaphragm 6 without decreasing the detection precision it is necessary to make the thickness of the diaphragm 6 thin.

However, with the kind of semiconductor substrate manufacturing method described above, after the pressure reference chamber 5 is formed with its interior nearly at a vacuum state it is necessary for a polishing step to be carried out to form the diaphragm 6. But when polishing progresses so as to make the diaphragm 6 thin (for example about 1 to 10 $\mu$m), during polishing the diaphragm 6 undergoes stress due to the pressure difference between the inside of the pressure reference chamber 5 and the outside and deforms as shown in FIG. 23C.

When deformations of the diaphragm 6 during polishing becomes large as much as not to be negligible, the thickness of the diaphragm 6 formed is uneven and the accuracy of the displacement of the diaphragm 6 corresponding to the pressure being detected falls. And, in some cases, the central part of the diaphragm 6 may come into contact with the opposite wall of the pressure reference chamber 5 so that further displacement of the diaphragm 6 is obstructed.

SUMMARY OF THE INVENTION

It is therefore an object of the present invention to provide a method for manufacturing a semiconductor substrate which, when a diaphragm constituting the rear wall of a pressure reference chamber is processed to a low thickness, does not adversely affect the diaphragm due to stress causing the diaphragm to deform, which is generated based on the pressure difference between the inside and the outside of a pressure reference chamber and to provide a semiconductor pressure sensor and the manufacturing method thereof.

According to a first aspect of the invention, in a concavity forming step a concavity is formed in a first substrate, and in a laminating step the first substrate is laminated with a second substrate in an atmosphere at atmospheric pressure and the concavity is thereby formed as a pressure reference chamber, after which the pressure reference chamber is evacuated in an evacuating step. The laminating step does not have to be carried out in an evacuated atmosphere, and therefore the laminating step can be carried out simply and easily. Furthermore, problems such as the substrate being deformed by a pressure difference between the inside and the outside of the pressure reference chamber do not arise when the thickness of a part of the substrate where the pressure reference chamber is formed is processed by polishing or the like or a step of forming devices there is carried out prior to executing the evacuating step, and consequently this processing can be carried out with good precision.

Preferably, in a connecting hole forming step, a connecting hole is formed in at least one of the first and second substrates so that when the first and second substrates have been laminated together the concavity to be used as a pressure reference chamber is connected to the outside. When this is done, after the laminating step is carried out, in carrying out the evacuating step, if the gas inside the pressure reference chamber is removed through this connecting hole and a sealing step is carried out to close the connecting hole after the evacuation, the pressure reference chamber can be evacuated surely.

The evacuating step is preferably carried out after a device forming step of forming devices constructing a pressure sensor is carried out. By this means, when a part of the substrate in which the pressure reference chamber is formed is used as a diaphragm, the diaphragm can be prevented from deforming due to a pressure difference across it while the substrate is being processed or the devices are being formed. Therefore, restrictions on the processing for diaphragm formation or device formation can be reduced and the accuracy of this processing can be increased.

In the laminating step, the concavity used as a pressure reference chamber may be sealed so that the inside thereof is isolated from the outside, and then in the evacuating step, by heat treatment being carried out, the gas inside the concavity may be made to combine with the substrate material and thereby consumed. By this means, it is possible to evacuate the inside of the pressure reference chamber simply and surely. In this evacuating step, oxygen remaining inside the concavity is combined with the substrate material to form an oxide, and as a result the inside of the pressure reference chamber is evacuated. Consequently, evacuation of the inside of the pressure reference chamber can be carried out simply and surely without using special reactants or the like.

To promote the above-mentioned reaction, the inside of the concavity may be surface-treated in advance so that semiconductor faces are exposed. In this case, the evacuating step can be carried out efficiently. As this surface treatment, an oxide film may be removed. When this is done, because semiconductor faces consume oxygen inside the pressure reference chamber more readily, the evacuating step can be carried out surely and rapidly.

When polishing is carried out to form a diaphragm by reducing the thickness of the part of the first substrate where the concavity used as a pressure reference chamber is formed, the polishing step is preferably carried out before the evacuating step. When this is done, the part being formed into a diaphragm does not deform under stress arising due to a pressure difference across it, and consequently a diaphragm used in a pressure sensor or the like can be formed with good accuracy.

Preferably, the thickness of the diaphragm is determined so that a maximum value of deflection which is derived from the thickness, a side length, an elastic modulus determined from a material of the diaphragm and a pressure uniformly acting on the surface of the diaphragm is equal to or lower than the thickness of the diaphragm. In this case, even when the thickness of the diaphragm is set thin, it is possible to reduce the deformation of the diaphragm cased by a pressure difference between the inside and the outside of a pressure reference chamber. Therefore, during a manufacturing process, even when the part of the substrate to become the diaphragm is polished to form the diaphragm after the inside of the pressure reference chamber is evacuated, problems caused by the deflection and deformation of the diaphragm can be suppressed and therefore, the diaphragm causing no obstacle for pressure detection can be obtained.

Preferably, the shape of the diaphragm is square. Further, when the diaphragm is formed from monocrystalline silicon, the ratio (L/H) of a side's length L to a thickness H of the diaphragm is preferably set to be smaller than 104. By this means also, even when the part of the substrate to become the diaphragm is polished after the inside of the pressure reference chamber is evacuated, problems caused by the deflection and deformation of the diaphragm can be suppressed and therefore, the diaphragm causing no obstacle for pressure detection can be obtained.

The shape of the diaphragm may be circle. In this case, the thickness of the diaphragm can be determined so that a maximum value of deflection which is derived from the thickness, a radius and an elastic modulus determined from a material of the diaphragm and a pressure uniformly acting on the surface of the diaphragm is equal to or lower than the thickness of the diaphragm. Also, when the diaphragm is formed from monocrystalline silicon, the ratio (R/H) of a radius R to a thickness H of the diaphragm is preferably set to be smaller than 56.

In these cases, even when the thickness of the diaphragm is set thin, it is possible to reduce the deformation of the diaphragm cased by a pressure difference between the inside and the outside of a pressure reference chamber. Therefore, during a manufacturing process, even when the part of the substrate to become the diaphragm is polished to form the diaphragm after the inside of the pressure reference chamber is evacuated, problems caused by the deflection and deformation of the diaphragm can be suppressed and therefore, the diaphragm causing no obstacle for pressure detection can be obtained.

A second aspect of the invention provides a method for manufacturing a semiconductor pressure sensor substrate. That is, the invention provides a method for manufacturing a semiconductor pressure sensor substrate having a pressure reference chamber on the rear side of a diaphragm, the method comprising: a concavity forming step of, by etching a surface of an active layer provided on a first supporting substrate with a PN junction therebetween, forming a concavity to become a pressure reference chamber leaving an active layer of a thickness corresponding to that of the diaphragm provided on its bottom side; a laminating step of laminating a second supporting substrate to the surface of the active layer; a first supporting substrate removing step of removing the most part of the first supporting substrate by etching; and a finishing etching step of further carrying out shallow etching on the etching face of the first supporting substrate removing step until the active layer becomes exposed. The first supporting substrate removing step is carried out using electrochemical stop etching with a depletion layer formed at the PN junction between the first supporting substrate and the active layer as a stopper.

Because the electrochemical stop etching used in the first supporting substrate removing step is carried out with a depletion layer formed at the PN junction between the first supporting substrate and the active layer as a stopper, there is no occurrence of the kind of sagging that arises when the first supporting substrate is removed by polishing, and the etching can be carried out leaving the first supporting substrate of a uniform thickness on the active layer. In the finishing etching, it is only necessary to carry out extremely shallow etching for removing the remaining depletion layer part of the first supporting substrate. Consequently, thickness variation caused by the finishing etching is small enough to be negligible. As a result, it is possible to form a diaphragm having extremely little thickness variation.

Therefore, with this second aspect of the invention, it is possible to obtain a diaphragm of a uniform film thickness, troublesome steps such as trench processing are unnecessary, and there is the highly valuable benefit that the process is simple and manufacturing costs can be made low. And, because the diaphragm and the concavity to become the pressure reference chamber are formed in the active layer, the thickness of the active layer can be made large irrespective of the thickness of the diaphragm, and thus the freedom of circuit design is increased. Also, positional alignment in the laminating step can be made unnecessary.

The active layer can be formed on the first supporting substrate by epitaxial growth. At this time, a concave or projecting alignment mark can be preformed in the upper face of the first supporting substrate. When this is done, a concave or projecting alignment mark corresponding to the alignment mark preformed in the first supporting substrate also appears in the surface of the active layer formed on the first supporting substrate. Then, in the concavity forming step, the concavity can be formed in a predetermined position on the basis of that alignment mark. Also, because after the finishing etching step an alignment mark appears at the junction between the first supporting substrate and the active layer, that is, at the exposed surface of the active layer, subsequent formation of devices and circuits can be carried out in predetermined positions in the active layer on the basis of this alignment mark.

In the first supporting substrate removing step, electrochemical stop etching to the depletion layer may be carried out after the first supporting substrate is partially removed by polishing. When this is done, as a result of polishing also being used, the amount of material to be removed by the electrochemical stop etching is reduced. Consequently, the process time can be shortened and cost reductions can be achieved with it still being possible to carry out uniform etching.

Also, by the laminating step being carried out in a vacuum, the pressure reference chamber can be made a vacuum chamber.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIG. 3 is a process flow chart showing the flow of a process for manufacturing the semiconductor pressure sensor substrate;

DETAILED DESCRIPTION OF THE PREFERRED EMBODIMENTS (First Preferred Embodiment)

A first preferred embodiment of the invention will now be described with reference to FIG. 1 through FIGS. 6A to 6C.

Figure 1:
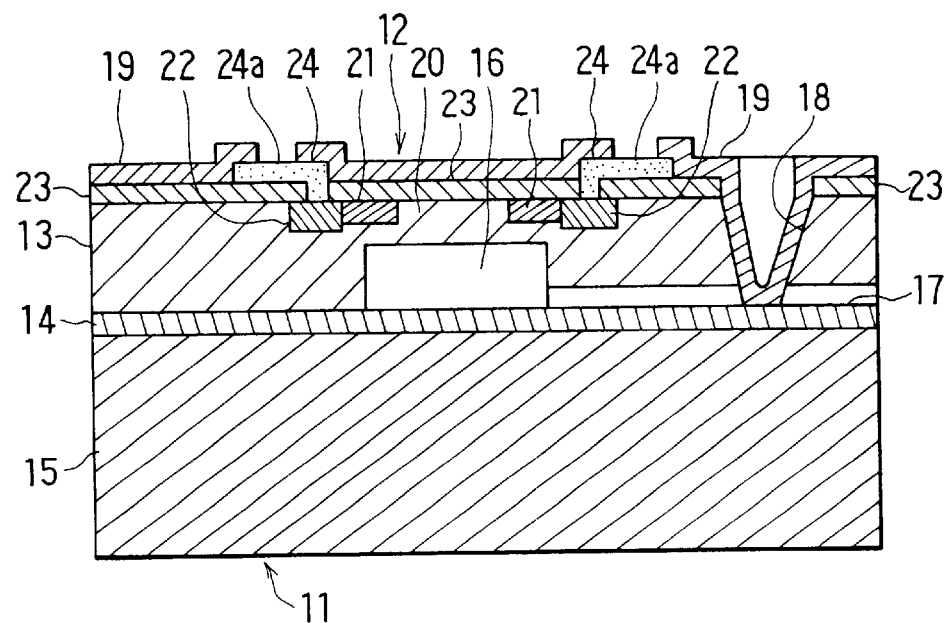
FIG. 1 is a schematic sectional view of a semiconductor pressure sensor substrate according to a first preferred embodiment of the invention.
Figure 2:
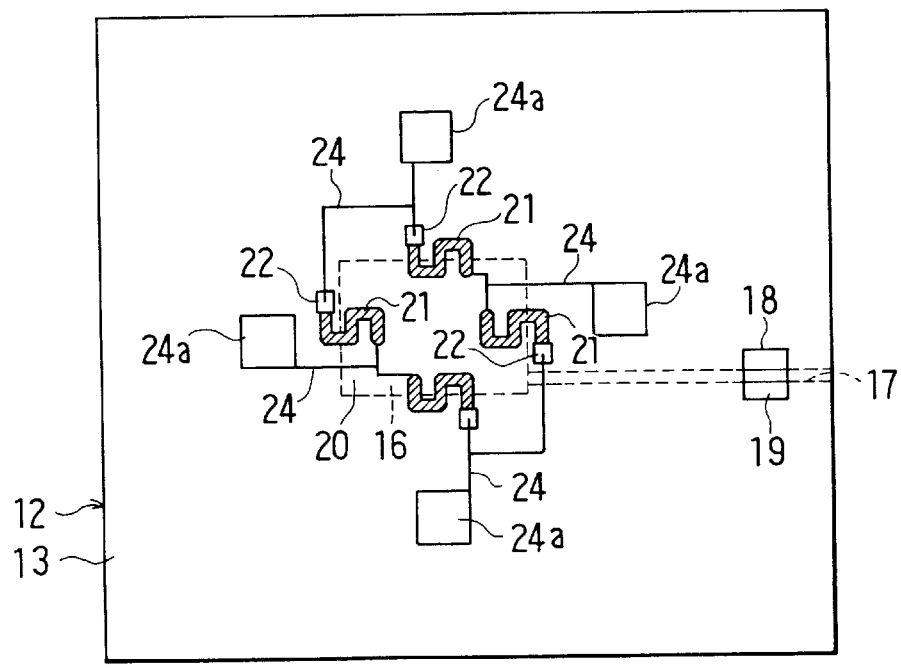
FIG. 2 is a plan view of the same semiconductor pressure sensor substrate.

FIG. 1 is a schematic sectional view and FIG. 2 a plan view of a semiconductor pressure sensor substrate 12 formed using a semiconductor substrate 11 made by applying a semiconductor substrate manufacturing method according to the invention.

A base silicon substrate 15 serving as a second substrate is laminated to the bottom face of a monocrystalline silicon substrate (hereinafter, referred to as "monosilicon substrates") 13 serving as a first substrate with an oxide film 14 therebetween. A pressure reference chamber 16 is formed isolated from the outside in a central part of the bottom face of the monosilicon substrate 13, its interior having had gas removed from it so that it is in a near-vacuum state. The pressure reference chamber 16 connects with a connecting hole 17 formed extending along the face of the monosilicon substrate 13. This connecting hole 17 is sealed by an oxide film 19 part-way along it at a sealing hole 18 formed from an upper surface of the semiconductor substrate 11.

A diaphragm 20 polished to a predetermined thickness forms the upper wall of the pressure reference chamber 16. This diaphragm 20 is set to a thickness such that it displaces in correspondence with an outside pressure. Four resistors 21 having a piezoresistance effect are formed in the monosilicon substrate 13 by a method such as diffusion in the diaphragm 20. High impurity concentration regions 22 for providing ohmic contact with the resistors 21 are also formed. Except for contact regions of the surfaces of these high impurity concentration regions 22, an oxide film 23 is formed as an insulating film over the entire surface of the semiconductor substrate 11.

Aluminum electrode patterns 24 are formed on the oxide film 23 so as to connect the resistors 21 in the form of a bridge, and bonding pads 24a are formed at the ends of these electrode patterns 24. Then, on the entire surface except for the bonding pads 24a, the same oxide film 19 as that effecting the above-mentioned sealing is disposed as a protective film. This semiconductor pressure sensor substrate 12 is used connected to an outside circuit at the bonding pads 24a by bonding wires (not shown). By this means, a voltage is impressed on the bridge circuit from outside and a detection output is extracted to outside.

When this semiconductor pressure sensor substrate 12 is exposed to an environment for pressure measurement, the diaphragm 20 displaces in correspondence with a stress arising in it due to the difference between the pressure acting on it from the outside and the pressure inside the pressure reference chamber 16. Consequently, the resistances of the resistors 21 are changed by a piezoresistance effect. This change in the resistances is extracted as a voltage signal and a detection output corresponding to the outside pressure is thereby obtained.

In this case, because the pressure reference chamber 16 has been provided in a near-vacuum state, that is, it contains almost no gas, even if its temperature fluctuates there is almost no fluctuating of the pressure inside the pressure reference chamber 16 in correspondence with that temperature fluctuation. Therefore, a pressure can be detected correctly without a temperature compensation circuit or the like being provided.

Next, a method for manufacturing this semiconductor pressure sensor substrate 12 will be described with reference to FIG. 3 through FIGS. 6A to 6C.

FIG. 3 is a process flow chart showing the manufacturing process in outline, and the following description is based upon this chart.

Figure 4A:
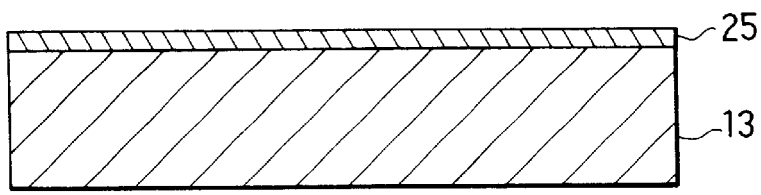
FIGS. 4A to 4E are schematic sectional views of a semiconductor pressure sensor substrate in different steps of the manufacturing process.
Figure 4B:
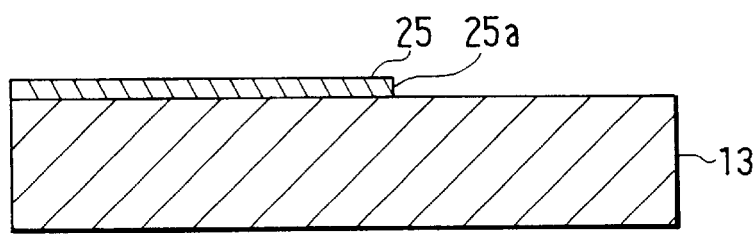

First, in an oxide film forming step P1, an oxide film 25 is formed by a method such as thermal oxidation on the surface of a monosilicon substrate 13 constituting a first substrate (FIG. 4A). In this case, the film thickness of the oxide film 25 is for example about 0.1 to 1.0 $\mu$m. This oxide film 25 can also be formed by CVD or the like instead of thermal oxidation.

Figure 4C:
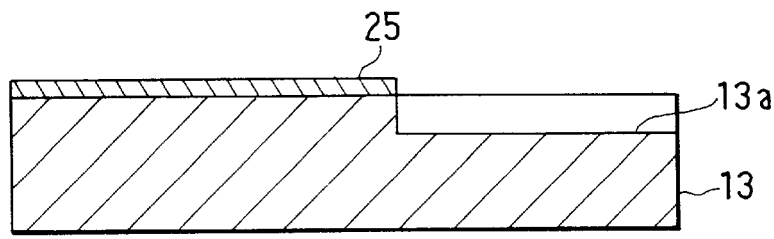
Figure 4D:
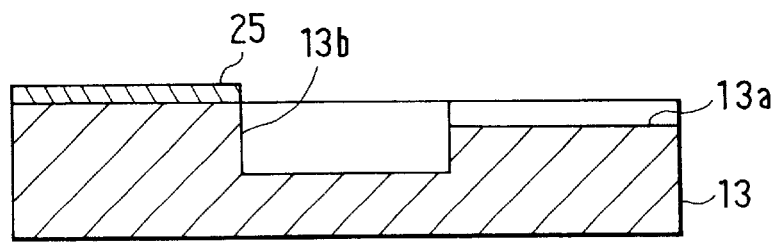
Figure 4E:
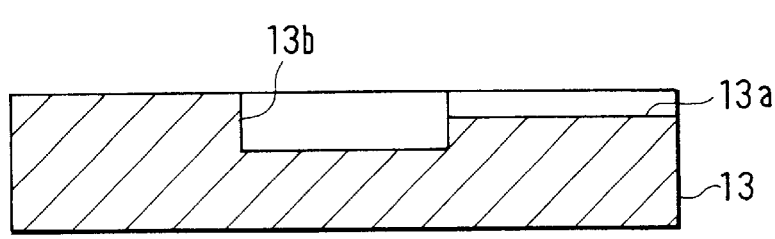

Then, in a connecting hole forming step P2, an opening is formed by photolithography in the oxide film 25 on the monosilicon substrate 13 (FIG. 4B), and a channel 13a to form a connecting hole 17 is formed by dry etching the exposed part of the monosilicon substrate 13 using fluorine ions or the like (FIG. 4C). The channel 13a is formed to a size such that for example its opening is 50 to 1000 $\mu$m wide and its depth is up to about 10 $\mu$m. As the etching process, for example wet etching using KOH (potassium hydroxide) liquid or TMAH (aqueous tetraethyl ammonia) can be used. Then, in a pressure reference chamber concavity forming step P3, an opening is formed by photolithography in the oxide film 25 and part of the exposed monosilicon substrate 13 is removed to form a concavity 13b used as a pressure reference chamber 16 (FIG. 4D). The depth of the concavity 13b is made greater than the depth of the channel 13a.

After that, in an oxide film removing step P4, the oxide film 25 formed on the surface of the monosilicon substrate 13 is removed by etching. The reason for the oxide film 25 being removed like this is to prevent lamination defects occurring when there is warp in the monosilicon substrate 13 in a following laminating step P5.

Figure 5A:
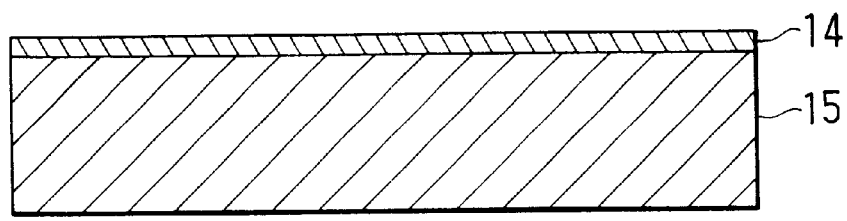
FIGS. 5A to 5C are schematic sectional views of a semiconductor pressure sensor substrate in different steps of the manufacturing process following on from FIG. 4E.
Figure 5B:
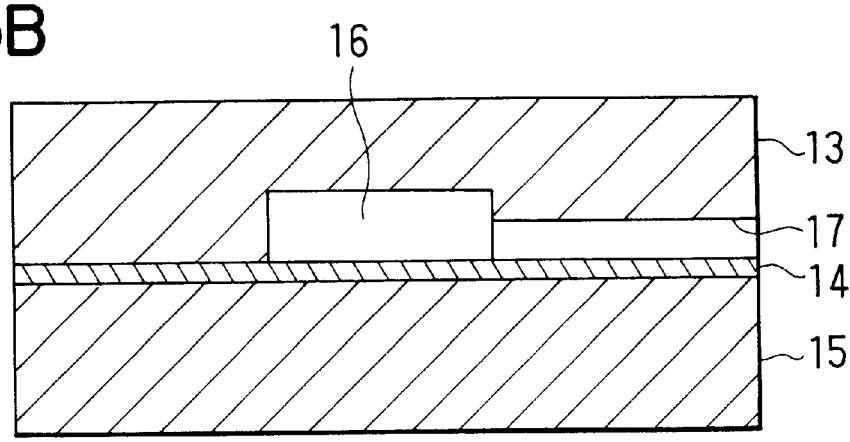

Meanwhile, separately, in an oxide film forming step P1a, an oxide film 14 is formed on the surface of a base silicon substrate 15 serving as a second substrate (FIG. 5A).

Next, in a laminating step P5, after a pretreatment is carried out on the monosilicon substrate 13 and the base silicon substrate 15, the face of the monosilicon substrate 13 in which the pressure reference chamber concavity 13b is formed and the face of the base silicon substrate 15 on which the oxide film 14 is formed are laminated together at atmospheric pressure into intimate contact (FIG. 5B), and then heat treatment is carried out. The heat treatment temperature is in the range 800° C. to 1150° C. and the heat treatment duration is from a minimum of half an hour in a case of high temperature to a maximum of three hours in a case of low temperature. By this means, a pressure reference chamber 16 is formed inside the laminated substrate. In this state, because the pressure reference chamber 16 is connected to the outside, the inside of the pressure reference chamber 16 is still at atmospheric pressure.

Figure 5C:
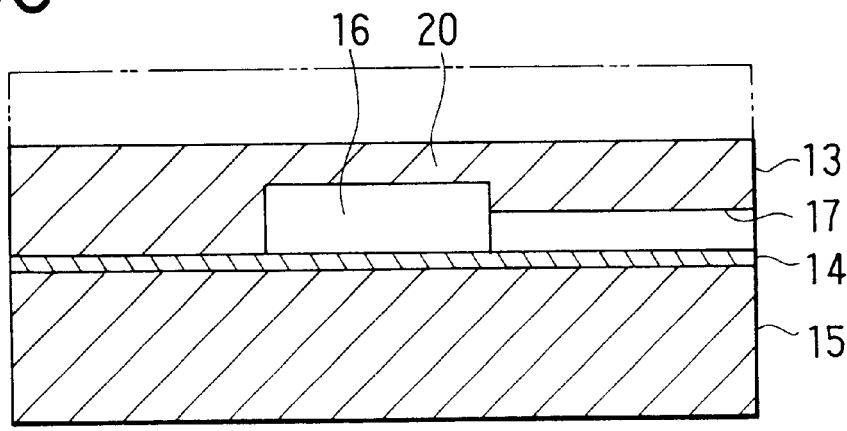

Then, in a polishing step P6, the upper face of the monosilicon substrate 13 is polished and the part thereof positioned above the pressure reference chamber concavity 13b is thereby formed as a diaphragm 20 (FIG. 5C). At this time, the thickness dimension to which the diaphragm 20 is adjusted by the polishing is for example about 1 to 10 $\mu$m. Preferably, the thickness of the diaphragm 20 is set to 5 $\mu$m or below. Since the pressure reference chamber 16 has been kept at atmospheric pressure, even when the thickness of the monosilicon substrate 13 corresponding to the diaphragm 20 has become low as a result of polishing, the diaphragm 20 does not distort under a differential pressure and consequently can be polished to a uniform thickness.

Figure 6A:
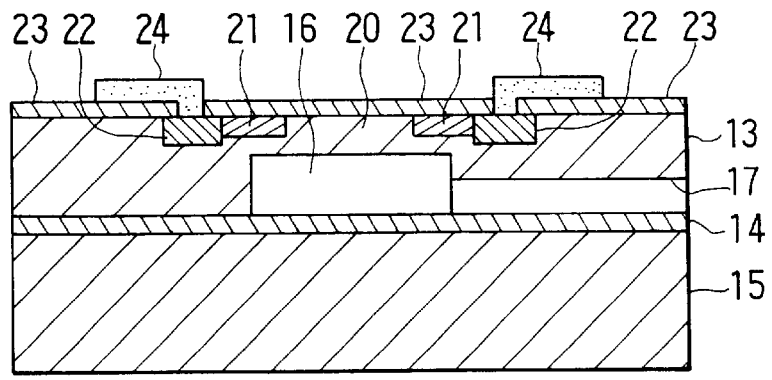
FIGS. 6A to 6C are schematic sectional views of a semiconductor pressure sensor substrate in different steps of the manufacturing process following on from FIG. 5C.

Then, a device forming step P7 of forming devices for enabling the substrate formed as described above to function as a semiconductor pressure sensor substrate 12 is carried out. Specifically, resistors 21 having a piezoresistance effect are formed in the diaphragm 20 by introducing an impurity using known technology such as the diffusion method, and after that, high impurity concentration regions 22 are formed in ohmic contact with the resistors 21 (FIG. 6A). Also, an oxide film 23 is formed and aluminum electrode patterns 24 connecting with the high impurity concentration regions 22 are formed on this oxide film 23.

Figure 6B:
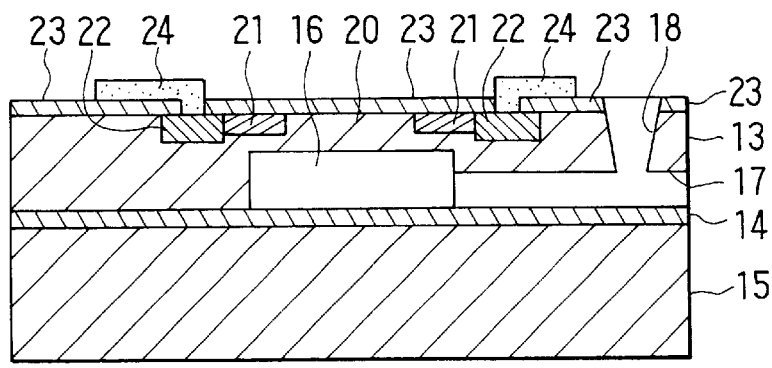

Then, in a sealing hole forming step P8, a sealing hole 18 is formed from the upper face of the monosilicon substrate 13. That is, photolithography is carried out on the upper face of the monosilicon substrate 13 to expose the silicon face of a part where the sealing hole 18 is to be formed and then etching is carried out to dig downward to the connecting hole 17 and thereby form a sealing hole 18 (FIG. 6B).

Figure 6C:
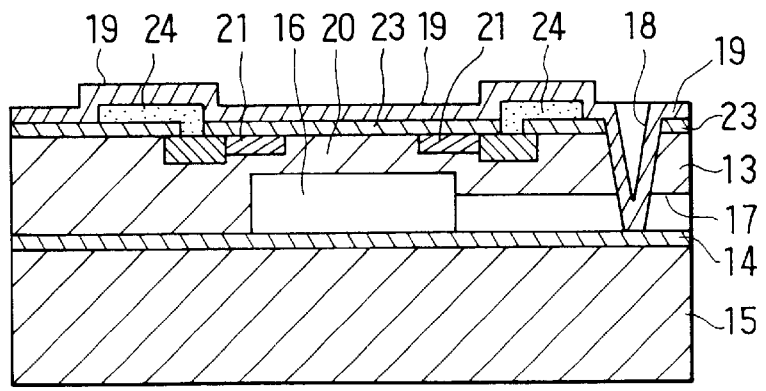

After that, in a sealing step P9 constituting an evacuating step, an oxide film 19 is formed over the entire upper surface of the monosilicon substrate 13 in a vacuum (FIG. 6C). As a result of this, an oxide film 19 is also formed in the sealing hole 18 and seals the connecting hole 17. As a result, the inside of the pressure reference chamber 16 is in a near-vacuum state. The pressure inside the pressure reference chamber 16 is preferably made below for example about 100 Pa (Pascals) as the level of the vacuum state, and this being set to a still lower pressure will yield still greater detection accuracy. A silicon nitride film or the like can be formed instead of the oxide film 19.

Finally, in an electrode pad exposing step P10, openings are formed in the oxide film 19 on bonding pad 24a of the electrode patterns 24 by photolithography, and a semiconductor pressure sensor substrate 12 of the construction shown in FIG. 1 and FIG. 2 is obtained.

According to this preferred embodiment, because the sealing step P9 wherein the pressure reference chamber 16 is evacuated is carried out after the diaphragm 20 is formed (after the polishing step P6), distortion of the diaphragm 20 during polishing due to a pressure difference between the inside and the outside of the pressure reference chamber 16 can be prevented. Therefore, it is possible to form the thickness of the diaphragm 20 uniformly and with good accuracy.

And, with this preferred embodiment, because as described above the thickness of the diaphragm 20 can be made thin, the area of the diaphragm 20 can be made small without the detection precision falling, and the device can thereby be made compact.

Also, with this preferred embodiment, because the connecting hole 17 is provided in advance and the pressure inside the pressure reference chamber 16 is reduced to a vacuum by the sealing hole 18 being sealed in a vacuum in sealing step P9 after the device forming step P7, the inside of the pressure reference chamber 16 can be evacuated surely and setting of the degree of vacuum can be carried out with certainty.

(Second Preferred Embodiment)

Figure 7:
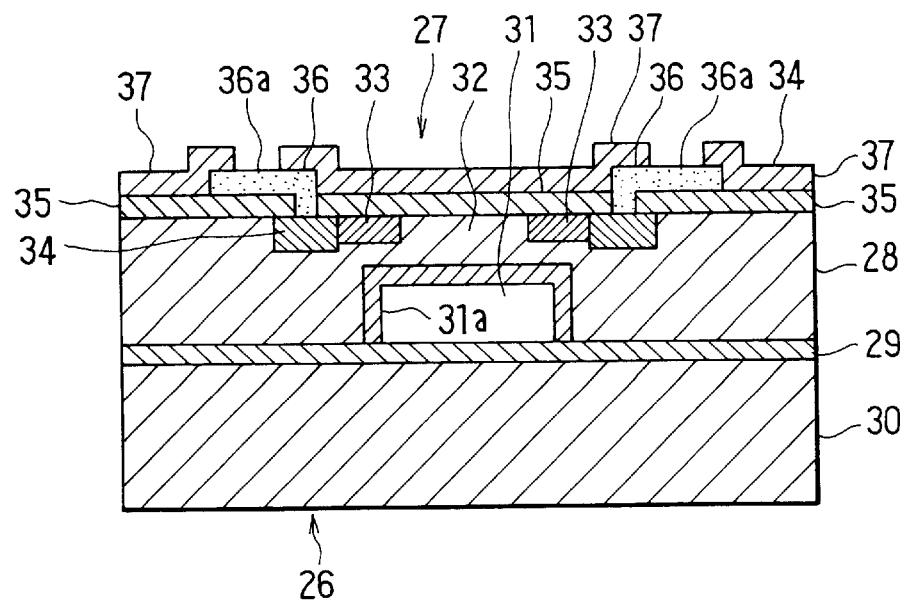
FIG. 7 is a schematic sectional view of a semiconductor pressure sensor substrate according to a second preferred embodiment of the invention.

FIG. 7 through FIGS. 12A to 12C show a second preferred embodiment of the invention, and points of difference between this second preferred embodiment and the first preferred embodiment will now be described. FIG. 7 is a sectional view and FIG. 8 a plan view of a semiconductor pressure sensor substrate 27 formed using a semiconductor substrate 26.

A base silicon substrate 30 serving as a second substrate is laminated to the bottom face of a monosilicon substrate 28 serving as a first substrate with an oxide film 29 therebetween. A pressure reference chamber 31 is formed isolated from the outside in a central part of the bottom face of the monosilicon substrate 28, its interior having been degassed so that it is in a near-vacuum state. And, an oxide film 31a formed in the process of this degassing as will be further discussed later is present on inner wall faces of the pressure reference chamber 31.

A diaphragm 32 of a predetermined thickness forms the upper wall of the pressure reference chamber 31. This diaphragm 32 is set to a thickness such that it displaces in correspondence with an outside pressure. Four resistors 33 and four high impurity concentration regions 34 are formed in the diaphragm 32. Except for contact regions of these high impurity concentration regions 34, an oxide film 35 serving as an insulating film is formed over the entire surface of the semiconductor substrate 26. Aluminum electrode patterns 36 connecting the four resistors 33 in the form of a bridge have bonding pads 36a formed at their ends. A protective oxide film 37 is disposed over the entire surface except for the bonding pads 36a.

Figure 10A:
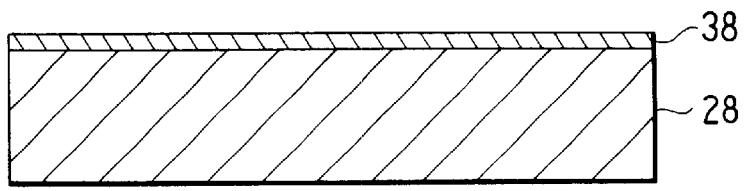
FIGS. 10A to 10D are schematic sectional views of a semiconductor pressure sensor substrate in different steps of the manufacturing process of FIG. 9.
Figure 10B:
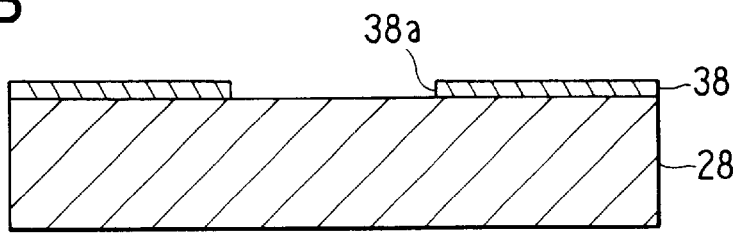
Figure 10C:
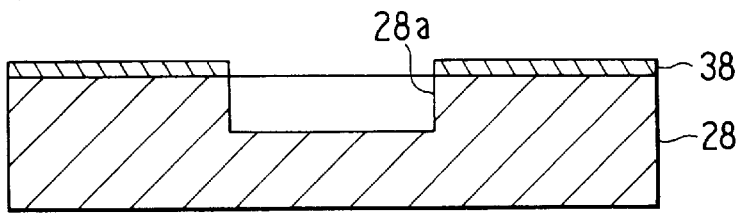
Figure 10D:
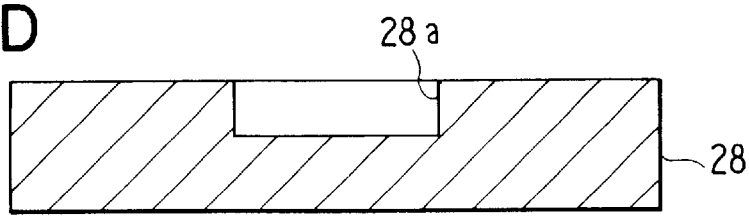

Next, a method for manufacturing this semiconductor pressure sensor substrate 27 will be described with reference to FIG. 9 through FIGS. 12A to 12C. First, in an oxide film forming step Ti, an oxide film 38 is formed by a method such as thermal oxidation on the surface of a monosilicon substrate 28 constituting a first substrate (see FIG. 10A). Then, in a pressure reference chamber concavity forming step T2, an opening is formed in the oxide film 38 on the monosilicon substrate 28 (FIG. 10B) and part of the exposed monosilicon substrate 28 is removed by etching to form a concavity 28a used as a pressure reference chamber 31 (FIG. 10C).

Figure 11A:
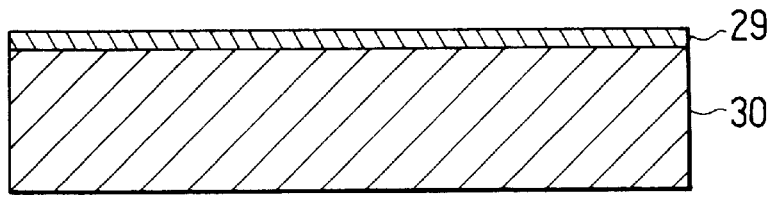
FIGS. 11A to 11C are schematic sectional views of a semiconductor pressure sensor substrate in different steps of the manufacturing process following on from FIG. 10D.
Figure 11B:
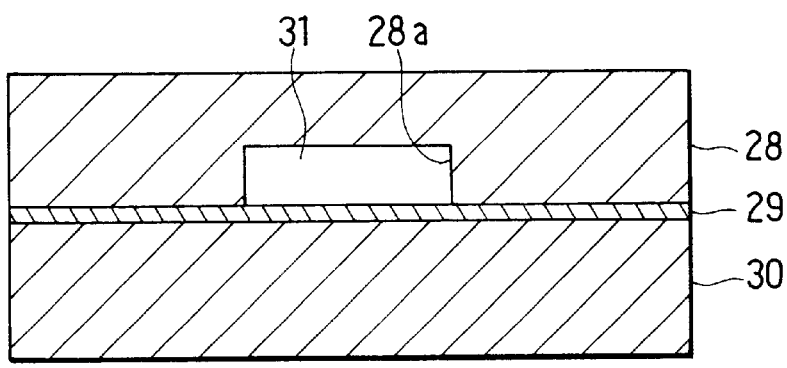
Figure 11C:
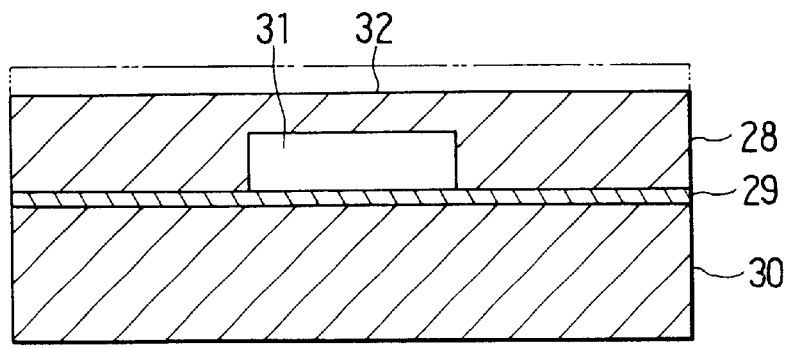

After that, in an oxide film removing step T3, the oxide film 38 formed on the surface of the monosilicon substrate 28 is removed by etching. The reason for the oxide film 38 being removed like this is to enable degassing of the inside of the concavity 28a used as a pressure reference chamber 31 to be carried out efficiently in a subsequent evacuating step T6 and to prevent lamination defects occurring due to warp of the monosilicon substrate 28. Meanwhile, separately, in an oxide film forming step T1a, an oxide film 29 is formed on the surface of a base silicon substrate 30 constituting a second substrate (FIG. 11A).

Next, in a laminating step T4, the monosilicon substrate 28 and the base silicon substrate 30 are each pretreated and are then laminated together at atmospheric pressure into intimate contact (FIG. 11B), after which heat treatment is carried out. The heat treatment temperature is in the range 800° C. to 1150° C. and the heat treatment duration is from a minimum of half an hour to a maximum of three hours, according to the temperature. By this means, a pressure reference chamber 31 is formed inside the laminated substrate. In this state, the inside of the pressure reference chamber 31 is still at atmospheric pressure.

Then, in a polishing step T5, from this state, the upper face of the monosilicon substrate 28 is polished and the part positioned above the pressure reference chamber concavity 28a is thereby formed as a diaphragm 32 (FIG. 1C). At this time, the thickness dimension to which the diaphragm 32 is adjusted by the polishing is for example about 1 to 10 m. Since the pressure reference chamber 31 is being held at atmospheric pressure, even when the thickness of the part corresponding to the diaphragm 32 has become low as a result of polishing, the diaphragm 32 does not distort under a differential pressure and consequently can be polished to a uniform thickness.

Figure 12A:
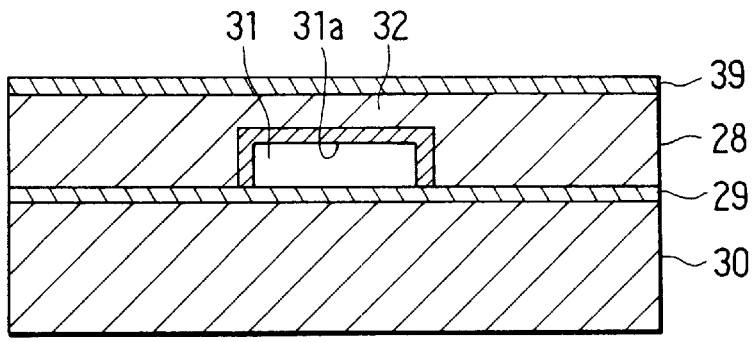
FIGS. 12A to 12C are schematic sectional views of a semiconductor pressure sensor substrate in different steps of the manufacturing process following on from FIG. 1C.
Figure 12B:
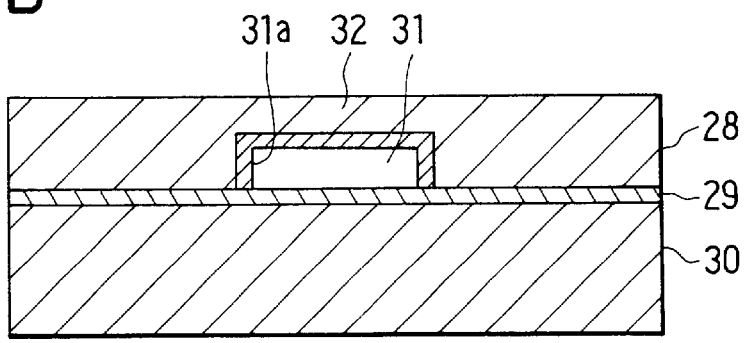
Figure 12C:
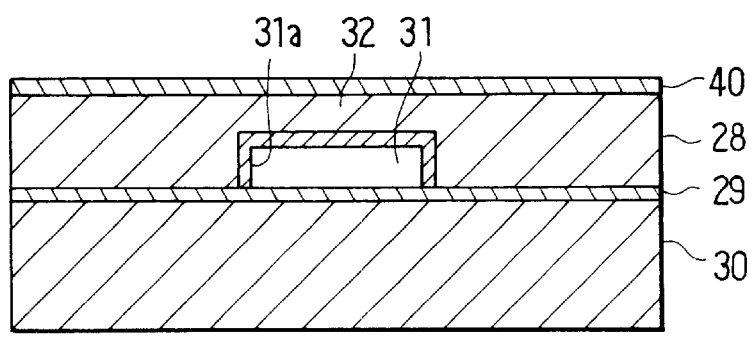

Next, an oxide film forming step T6 is carried out as an evacuating step. In this oxide film forming step T6, heat treatment is carried out for example at a temperature of 1150° C. to 1200° C. and for a duration of half an hour to five hours. At this time, inside the pressure reference chamber 31, remaining oxygen combines with silicon of the walls of the pressure reference chamber 31 to form an oxide film 31a and is thereby consumed. As a result, the pressure inside the pressure reference chamber 31 falls to a near-vacuum (FIG. 12A). Also, at this time, an oxide film 39 is similarly formed on the upper face of the monosilicon substrate 28.

Figure 8:
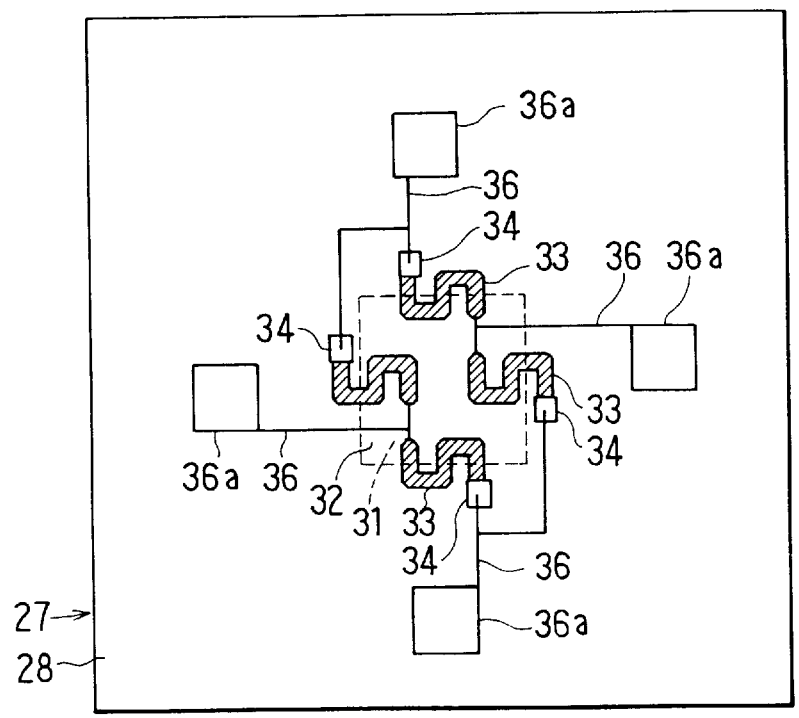
FIG. 8 is a plan view of the same semiconductor pressure sensor substrate.
Figure 9:
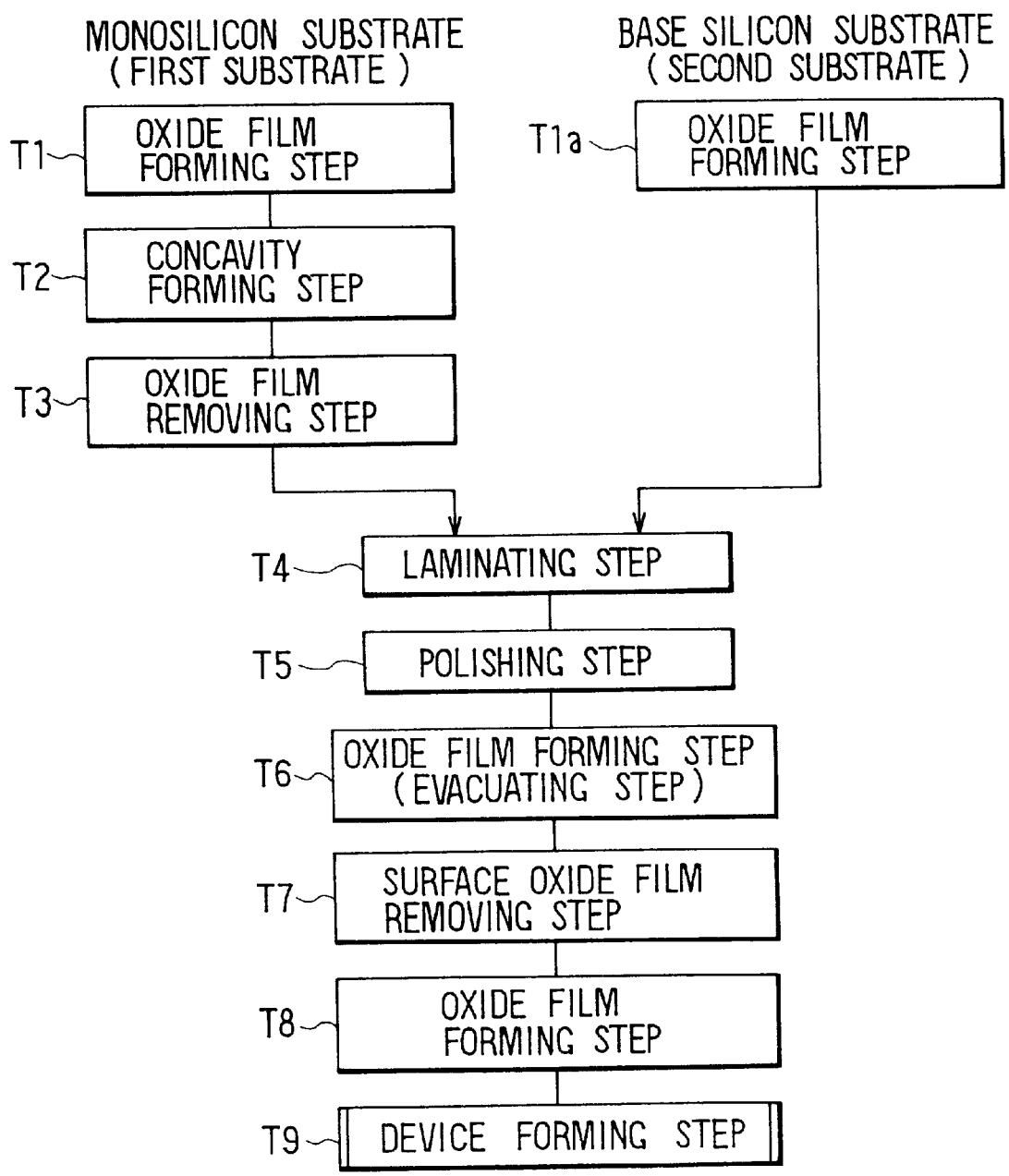
FIG. 9 is a process flow chart showing the flow of a process for manufacturing the semiconductor pressure sensor substrate according to the second preferred embodiment.

Next, in a surface oxide film removing step T7, the oxide film 39 formed in the last step is removed (FIG. 12B), and then in an oxide film forming step T8 a new oxide film 40 is formed (FIG. 12C) and a semiconductor substrate 26 is thereby completed. After that, in the same way as that described above, to enable the substrate to function as a semiconductor pressure sensor substrate 27, resistors 33 having a piezoresistance effect and high impurity concentration regions 34 for providing ohmic contact with the resistors 33 are formed in the diaphragm 32 and aluminum electrode patterns 36 are formed, and the semiconductor pressure sensor substrate 27 shown in FIGS. 7, 8 is thereby completed.

According to this second preferred embodiment, because the inside of the pressure reference chamber 31 is evacuated by heat treatment being carried out so as to form an oxide film 31a and thereby consume residual oxygen inside the pressure reference chamber 31, the step is simple and the pressure reference chamber 31 can be evacuated surely. Thus the polishing in the polishing step can be carried out with the inside of the pressure reference chamber 31 kept at atmospheric pressure and the diaphragm 32 can be formed to an accurate thickness.

(Third Preferred Embodiment)

FIG. 13 through FIGS. 15A to 15D show a third preferred embodiment of the invention, and points of difference from the first and second preferred embodiments are in that a pressure detecting sensor chip 41 in which an integrated circuit serving as a signal processing circuit is also integrally formed in addition to devices for forming a pressure sensor is constructed. Also, in the manufacturing method of the pressure detecting sensor chip 41, unlike the first and second preferred embodiments, a laminating step is carried out in a vacuum, after which a diaphragm is formed through a polishing step.

In this preferred embodiment, to suppress the occurrence of problems described in the "Related Art", a thickness dimension of the diaphragm being formed is set to satisfy a conditional expression as described later.

Figure 13:
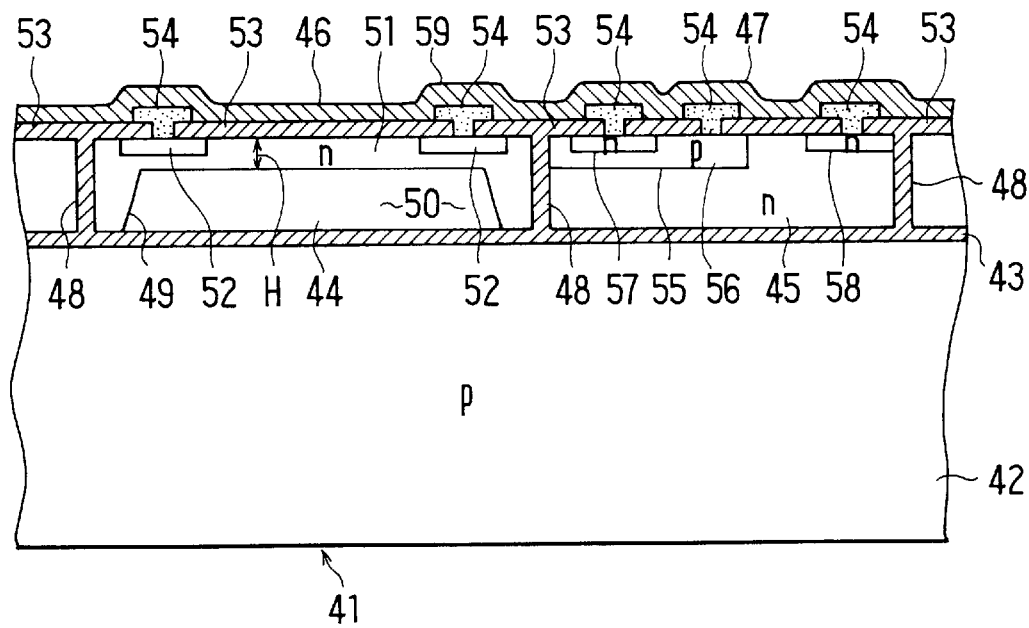
FIG. 13 is a schematic sectional view of a semiconductor pressure sensor substrate according to a third preferred embodiment of the invention.
Figure 14:
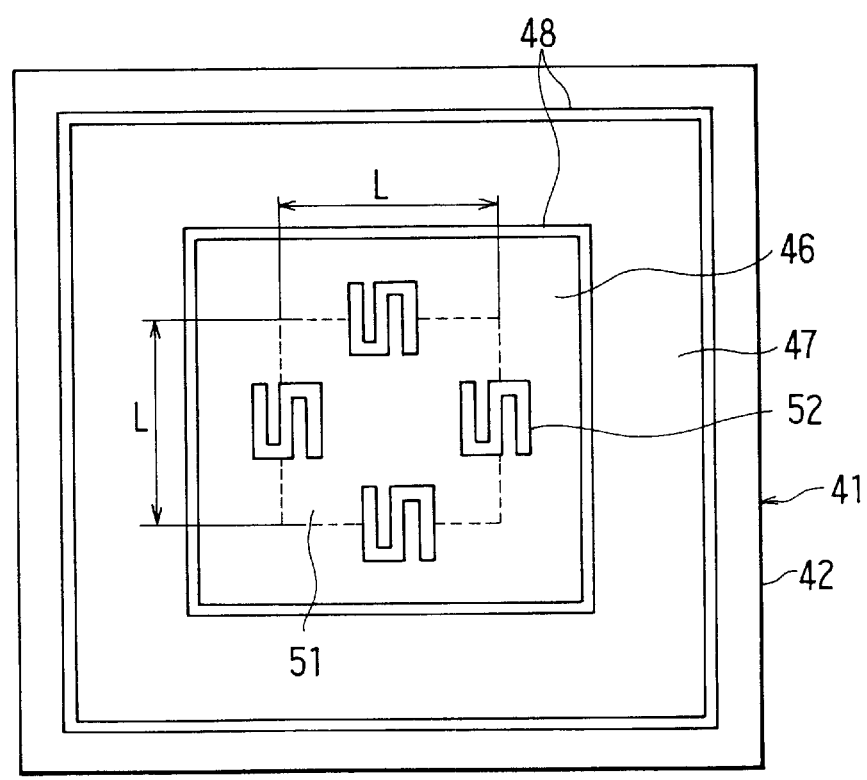
FIG. 14 is a plan view of the same semiconductor pressure sensor substrate.

FIG. 13 is a schematic sectional view and FIG. 14 a plan view of a semiconductor pressure sensor chip 41, which is a semiconductor device.

As shown in FIGS. 13, 14, an oxide film 43 for insulation is formed on a p-type base silicon substrate 42 serving as a supporting substrate. Device formation regions 44, 45 being semiconductor layers are formed on the base silicon substrate 42 interposing the oxide film 43 therebetween. The device formation region 44 is provided as a region where a pressure sensor device 46 is to be formed. The device formation region 45 is provided as a region where an integrated circuit 47 is to be formed. Electrical isolation between the device formation regions 44, 45 is achieved by a silicon oxide film 48 serving as a polishing stopper. That is, trench separation structure is formed by the silicon oxide film 48.

Each of the device formation regions 44, 45 consists of a monosilicon film formed by using a lamination technique as described later. An n-type impurity is introduced in each of the monosilicon films. The monosilicon film has a relatively large thickness from several micrometers to 20 µm, for example.

In a part of the device formation region 44 which makes contact with the oxide film 43, a concavity 49 of a predetermined shape is formed to a predetermined depth by etching. The opening of the concavity 49 is covered by the oxide film 43, thereby forming a pressure reference chamber 50 inside the device formation region 44. The inside of the pressure reference chamber 50 is set to a vacuum or a predetermined reduced pressure and provides a reference pressure which is not affected by temperature variations upon measurement of pressure.

By forming the pressure reference chamber 50 in the device formation region 44, an n-type layer part of the device formation region 44 positioned at an upper side thereof functions as a diaphragm 51. In the diaphragm 51, four resistor regions 52 for pressure detection use are formed at a surface thereof in positions corresponding to side walls of the pressure reference chamber 50. The resistor regions 52 are provided so that, when the diaphragm 51 displaces in response to pressure added thereto, the displacement of the diaphragm 51 is detected as changes of resistances due to the piezoresistance effect.

An oxide film 53 is formed on the surface of the device formation region 44 openings are formed in the oxide film 53 corresponding to the resistor regions 52, and the resistor regions 52 are connected to form a bridge circuit by an aluminum electrode film 54 contacting resistor regions 52 through the openings.

In the device formation region 45, an integrated circuit 47 is constructed from various kinds of devices formed therein. For example, in FIG. 13, a bipolar transistor 55 is formed. In this bipolar transistor 55, a p-type base region 56, an n-type emitter region 57 and an n-type contact region 58 are formed in an n-type device formation region serving as a collector region. Openings are formed in the oxide film 53 corresponding to the base region 56, emitter region 57 and contact region 58. The aluminum electrode films 54 contact the base region 56, emitter region 57 and contact region 58 through the openings, respectively. Each of the aluminum electrode films 54 is connected to the other circuit devices. It is to be noted that, although not shown in the drawing, various kinds of circuit devices such as MOSFETs, diodes and resistors are formed in the device formation -region 45, thereby constructing the integrated circuit 47.

The periphery of the integrated circuit 47 is, as described above, encompassed by the silicon oxide film 48 forming the trench separation structure as well as serving as a polishing stopper, whereby the integrated circuit 47 is insulated and isolated from the pressure sensor 46. Further, a protective film 59 is formed on an entire surface of the sensor chip 41 for pressure detection except for bonding pads not shown in the drawing.

In the construction described above, the thickness H (mm) of the diaphragm 51 is set to satisfy the conditions derivable in a manner as explained below.

A formula defined in a case of calculating an amount of deflection of a plate, the periphery of which is fastened, caused by pressure applied thereto is shown by the following expression (A):

$$W = \alpha \times (P \times L^4)/(E \times H^3) \quad (A)$$

wherein W (mm) is a maximum value of deflection amount, H (mm) is a thickness dimension of the plate, P (kgf/mm$^2$) is a pressure applied to the plate, E (kgf/mm$^2$) is an elastic modulus of the plate, and α is a coefficient resulting from the plane shape of the plate.

When the formula (A) is applied to the pressure sensor 46 of the present embodiment, since the plane shape of the diaphragm 51 is a square, a side length dimension of which is L (mm), the value of α in the formula (A) is given as 0.014. Therefore, the above formula (A) can be written as follows:

$$W = 0.014 \times (P \times L^4)/(E \times H^3) \quad (B)$$

Pressure P (kgf/mm$^2$) received by the diaphragm 51 is given as a value obtained by subtracting a reference pressure Ps in the pressure reference chamber 50 (a reduced pressure or a vacuum) from a pressure Po acting on a pressure receiving face of the diaphragm 51. When the reference pressure is vacuum for example, that is, the reference pressure Ps is 0 (kgf/mm$^2$), the pressure P becomes equal to the pressure Po. Therefore, assuming that the pressure P received by the diaphragm 51 is one barometric pressure in a normal state, the pressure P is 1.033×10$^{-2}$ kgf/mm$^2$. Also, since the diaphragm 51 consists of monocrystalline silicon, the elastic modulus E is 17000 kgf/mm².

When the maximum value of the deflection amount W is smaller than the thickness dimension H of the diaphragm 51, the deflection of the diaphragm does not adversely affect the measurement of pressure carried out by the pressure sensor 46. That is, it is enough for the pressure sensor 46 to satisfy the following a condition equation (C):

$$W = 0.014 \times (P \times L^4)/(E \times H^3) < H \quad (C)$$

When the specific values of the pressure P and elastic modulus E are substituted in the condition equation (C), a condition with respect to a ratio of the side length dimension L to the thickness dimension H in the diaphragm 51 can be obtained as follows:

$$(L/H) < 104 \quad (D)$$

In other words, when the thickness dimension H of the diaphragm 51 is set against the side length dimension L thereof so as to satisfy the condition equation (D), the maximum value of the deflection amount w can be limited below the thickness dimension H. In this case, for example, when the thickness dimension H of the diaphragm 51 is set to about 2 μm, the side length dimension L is set to a value smaller than 208 μm.

Next, the manufacturing method of the sensor chip 41 for pressure detection use is described with reference to cross sectional views illustrating respective manufacturing steps of FIGS. 15A–15D and 16A–16C.

Figure 15A:
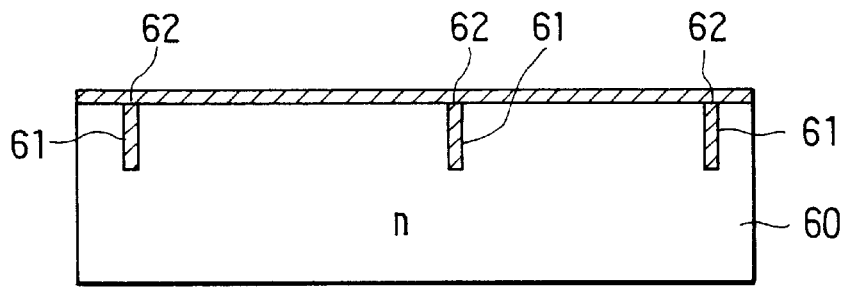
FIGS. 15A to 15D are schematic sectional views of a semiconductor pressure sensor substrate in different steps of a manufacturing process.

In this preferred embodiment, as a substrate for semiconductor layers, a monosilicon substrate 60 into which an n-type impurity has been introduced is adopted as shown in FIG. 15A. First, in a trench forming step, trenches 61 are formed to a predetermined depth in the surface portion of the monosilicon substrate 60 to form oxide films 48 therein, which are provided to isolate the device formation region 44 from the device formation region 45. The silicon oxide film 48 in the trench 61 is not only to insulate and isolate the pressure sensor device 46 from the integrated circuit 47 but also to function as a polishing stopper in a polishing step carried out when the diaphragm 51 is formed.

Specifically, in the trench forming step, an oxide film such as a plasma enhanced chemical vapor deposition terralxy ortho silicate (PE-CVD TEOS) film is deposited by a predetermined film thickness. The oxide film serves as a mask of etching. Next, parts of the oxide film corresponding to the positions at which the trenches 61 are to be formed are removed by a photolithography process. After that, anisotropic etching is carried out by a process such as dry etching. Due to this anisotropic etching, the oxide film consisting of the PE-CVD TEOS film and silicon is etched away to form the trenches 61.

Figure 15B:
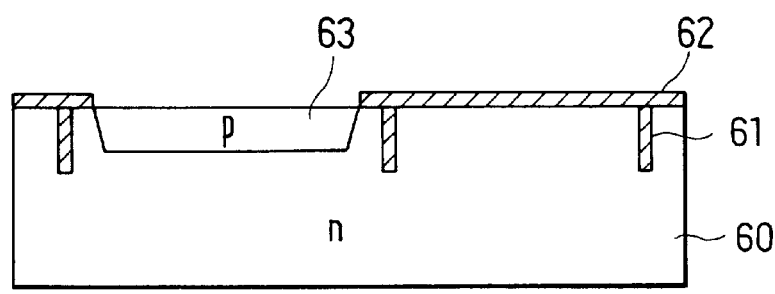

Next, in an oxide film forming step, the silicon oxide film 48 is formed on the inner surfaces of the trenches 61 and a silicon oxide film 62 is formed on the surface of the semiconductor substrate 60. In detail, the silicon oxide films 48, 62 are formed by a thermal oxidation process such as a low pressure high temperature oxide (LP-HTO) method, whereby the surface of the semiconductor substrate 60 is made flat. Following to this, an opening is formed in the oxide film 62 by removing the oxide film 62 in a region where the pressure reference chamber 50 is to be formed. A p-type region 63 is formed by introducing a p-type impurity to a predetermined depth in the semiconductor substrate 60 through the opening (FIG. 15B).

Figure 15C:
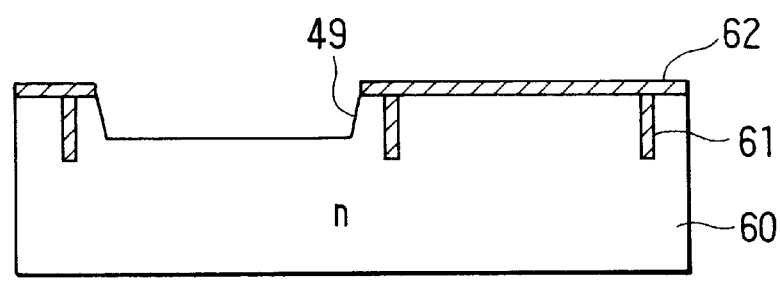

Subsequently, in a concavity forming step, the p-type region 63 is selectively etched and thereby removed (FIG. 15C). As a method for selectively etching only the p-type region 63, there is an electrochemical stop etching in which the substrate is immersed in an etchant while the PN junction therein is reverse-biased. According to this etching method, when the whole p-type region 63 is etched away, current flows because of the disappearance of the PN junction, thereby forming an anode oxide film on the etched surface. When the silicon layer to be etched turns to the anode oxide film, because the silicon layer is not exposed, the etching is stopped. As a result, it is possible to form a concavity 49 by removing the p-type region 63 due to the above etching process.

It is to be noted that the concavity 49 for the pressure reference chamber 50 can be formed by etching the semiconductor substrate to a predetermined depth using normal dry etching or the like, in addition to making use of the electrochemical stop etching.

Figure 15D:
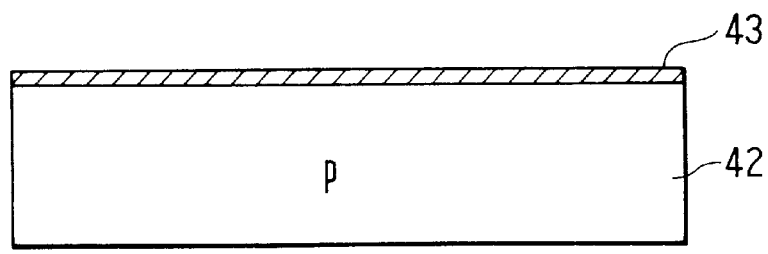

On a surface of a base silicon substrate 42 consisting of monocrystalline silicon, which is used as a supporting substrate, in an oxide film forming step, an oxide film 43 of a predetermined thickness is formed by a method such as thermal oxidation (FIG. 15D). This oxide film 43 serves as an insulation film to the device formation regions 44, 45 as described above.

Figure 16A:
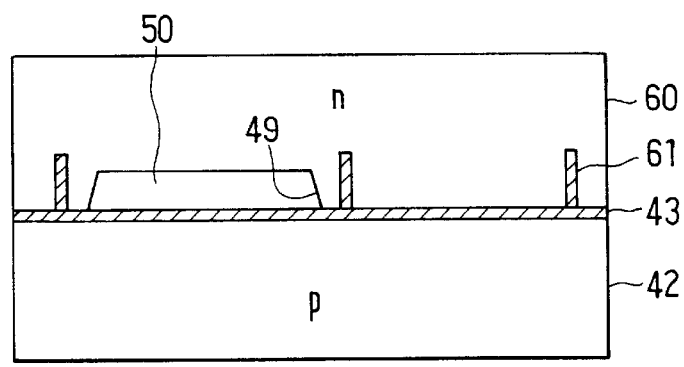
FIGS. 16A to 16C are schematic sectional views of a semiconductor pressure sensor substrate in different steps of the manufacturing process following on from FIG. 15D.

Next, in a laminating step, after a predetermined pretreatment is carried out to each of the base silicon substrate 42 and the semiconductor substrate 60 to turn the surfaces thereof in a state suitable for lamination, the face of the base silicon substrate 42 at which the oxide film 43 has been formed and the face of the semiconductor substrate 60 at which the concavity 49 has been formed are laminated together in an atmosphere of reduced pressure (vacuum) (FIG. 16A). Thereafter, bonding strength of the laminated faces is increased due to heat treatment.

Figure 16B:
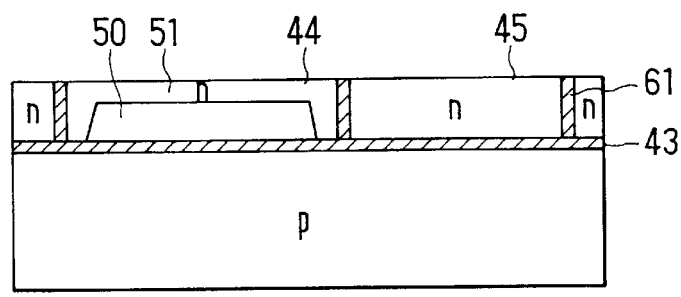

In a polishing step, polishing is carried out from the upper surface of the semiconductor substrate 60, whereby the n-type layer positioned above the pressure reference chamber 50 is formed as the diaphragm 51 (FIG. 16B). At this time, the thickness dimension of the diaphragm 51 adjusted by polishing is for example from 1 tm to 10 am satisfying the above-mentioned conditions. Therefore, even when the thickness of the diaphragm 51 is made thin due to polishing, because a maximum value W of deflection amount of the diaphragm 51 caused by a pressure difference P is not larger than the thickness dimension H of the diaphragm 51, the diaphragm 51 can be polished to a nearly uniform thickness.

Figure 16C:
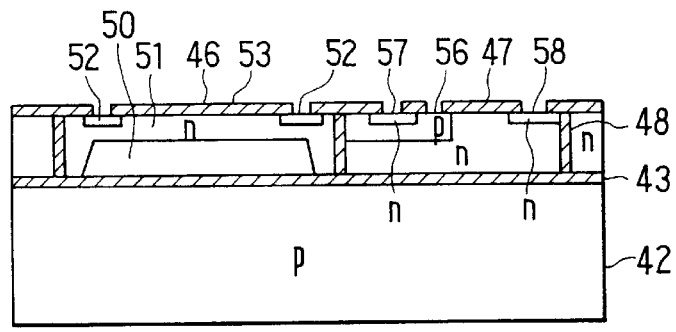

After that, a device forming step is carried out to form devices to be operable as the pressure sensor chip 41. That is, resistors 52 having a piezo resistance effect are formed in the diaphragm 51 by introducing an impurity therein with a known method such as diffusion. Also, the base region 56, the emitter region 57 and the contact region 58 for forming the bipolar transistor 55 as a part of the integrated circuit 47 are formed in the device formation region 45 (FIG. 16C).

Finally, in an electrode pad opening forming step, openings are formed in an oxide film 53 by a photolithography process. The openings are formed at positions where bonding pads of aluminum electrodes 54 are to be deposited. As a result, the sensor chip 41 as shown in FIGS. 13 and 14 can be completed.

According to this preferred embodiment, since the thickness dimension H of the diaphragm 51 is set to satisfy the conditions shown by the equation (D), even in a case where the pressure reference chamber 50 is formed by lamination of the base silicon substrate 42 and the semiconductor substrate 60 in an atmosphere of a vacuum and a polishing step is carried out to the semiconductor substrate 60 to form the diaphragm 51, the deflection amount of the diaphragm 51 can be suppressed in the course of polishing. Therefore, the process of non-uniform thickness caused by the deformation of the diaphragm 51 can be prevented.

Also, according to the present preferred embodiment, since the pressure sensor device 46 and the integrated circuit 47 are integrally provided in the sensor chip 41 for pressure detection use, the signal after the detection signal of the pressure sensor device 46 has been subject to a predetermined signal processing can be generated as an output signal.

Generally, to form the devices of the integrated circuit 47, a certain depth of a semiconductor region is necessary, which is larger than the thickness dimension H of the diaphragm 51 in a normal pressure sensor device 46. In the present preferred embodiment, because the pressure reference chamber 50 is provided by forming the concavity 49 in the device formation region 44, it is possible to ensure a sufficient thickness of a semiconductor region in the device formation region 45 in which the integrated circuit 47 is formed. Therefore, flexibility of design to form the integrated circuit 47 can be enhanced.

(Fourth Preferred Embodiment)

FIGS. 17 and 18A–18D show the fourth preferred embodiment. A semiconductor pressure sensor chip 64 of the fourth preferred embodiment is different from the pressure sensor chip of the third preferred embodiment in that a discrete device structure is adopted, that is, an integrated circuit 47 is not formed but only a pressure sensor device 46 is formed in the chip and in that a concavity for a pressure reference camber is not formed by etching silicon of a semiconductor substrate.

In the semiconductor pressure sensor chip 64, an oxide film 66 having a predetermined film thickness for forming a pressure reference chamber is formed on a p-type base silicon substrate 65 serving as a supporting substrate. That is, the pressure reference chamber 67 is formed by forming an opening of a square in the oxide film 66. On the pressure reference chamber 67, a diaphragm 68 is provided. The diaphragm 68 consists of monocrystalline silicon and has a predetermined thickness dimension H. Formed to surround the diaphragm 68 is an oxide film 69 constructing a trench structure on the base silicon substrate 65.

In the diaphragm 68, four resistor regions 70 for pressure detection use are formed at a surface thereof in positions corresponding to end portions of the pressure reference chamber 67. The resistor regions 70 are provided so that, when the diaphragm 68 displaces in response to pressure added thereto, the displacement of the diaphragm 68 is detected as changes of resistances due to the piezoresistance effect. An oxide film 71 is formed on the surface of the diaphragm 68. Openings are formed in the oxide film 71 corresponding to the resistor regions 70, and the resistor regions 70 are connected to form a bridge circuit by an aluminum electrode film 72 contacting resistor regions 52 through the openings. Further, a protective film 73 is formed on an entire surface of the semiconductor pressure sensor chip 64 except for bonding pads not shown in the drawing.

In the construction described above, the thickness h (mm) of the diaphragm 68 is set to satisfy the same conditions as in the third preferred embodiment. That is, the formula (B) can be obtained based on the shape of the diaphragm 68 from the formula (A) and the maximum value W of a deflection amount of the diaphragm 68 can be calculated using the formula (B). As conditions that the deflection amount maximum value W is smaller than the thickness dimension H of the diaphragm 68, the condition equation (C) can be used. As a result, the conditions with respect to the thickness dimension H of the diaphragm 68 as shown in the equation (D) is obtained.

When the thickness dimension H of the diaphragm 68 is set against the side length dimension L thereof so as to satisfy the condition equation (D), the maximum value of the deflection amount W can be limited below the thickness dimension H. In this case, for example, when the thickness dimension H of the diaphragm 68 is set to about 2 $\mu$m, the side length dimension L is set to a value smaller than 208 $\mu$m.

Next, the manufacturing method of the pressure sensor chip 64 is described with reference to FIGS. 18A–18D.

In this preferred embodiment, as a substrate for semiconductor layers, a monosilicon substrate 74 into which an n-type impurity has been introduced is adopted as shown in FIG. 15A. First, in a trench forming step, trenches 75 are formed to a predetermined depth in the surface portion of the monosilicon substrate 74 to form silicon oxide films 69 therein, which are provided corresponding to an area in which the diaphragm 68 is to be formed. The silicon oxide film 69 in the trench 75 is to function as a polishing stopper in a polishing step carried out when the diaphragm 51 is formed.

Figure 18A:
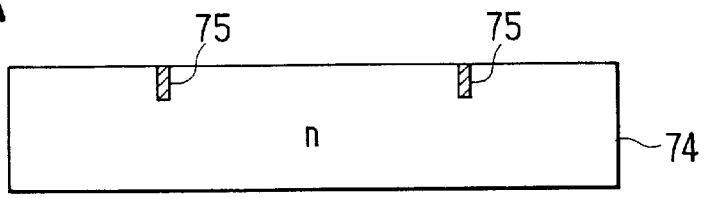
FIGS. 18A to 18D are schematic sectional views of a semiconductor pressure sensor substrate in different steps of a manufacturing process.
Figure 18B:
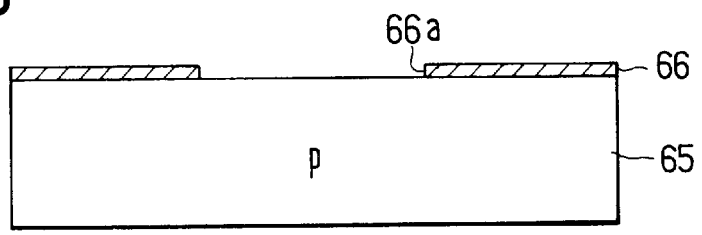

Next, on a surface of a base silicon substrate 65 consisting of monocrystalline silicon, which is used as a supporting substrate, in an oxide film forming step, an oxide film 66 of a predetermined thickness is formed by a method such as thermal oxidation (FIG. 18B). In this oxide film 66, an opening 66a of a square shape is formed at a position corresponding to the pressure reference chamber 67 by photolithography process.

Figure 18C:
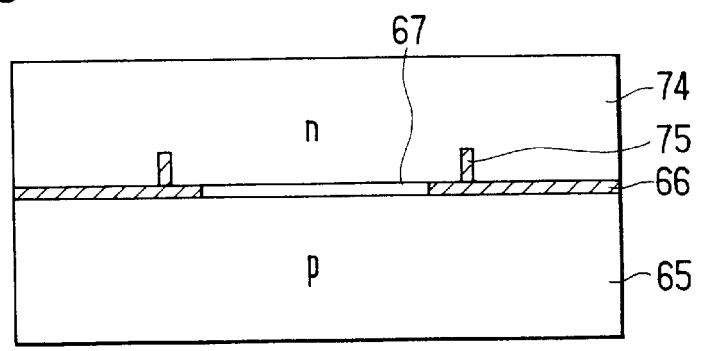

Next, in a laminating step, after a predetermined pretreatment is carried out to each of the base silicon substrate 65 and the semiconductor substrate 74 to turn the surfaces thereof in a state suitable for lamination, the face of the base silicon substrate 65 at which the oxide film 66 has been formed and the face of the semiconductor substrate 74 at which the trenches 75 have been formed are laminated together in an atmosphere of a vacuum (FIG. 18C). Thereafter, bonding strength of the laminated faces is increased due to heat treatment. As a result, a space equivalent to the thickness dimension of the oxide film 66 is formed at the opening 66a of the oxide film 66 and is utilized as the pressure reference chamber 67.

Figure 18D:
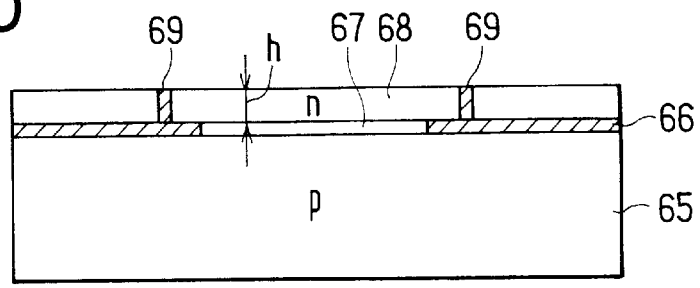

In a polishing step, polishing is carried out from the upper surface of the monosilicon substrate 74, whereby the n-type layer positioned above the pressure reference chamber 67 is formed as the diaphragm 68 (FIG. 18D). At this time, the thickness dimension of the diaphragm 68 adjusted by polishing is for example from 1 $\mu$m to 10 $\mu$m satisfying the above-mentioned conditions. Therefore, even when the thickness of the diaphragm 68 is made thin due to polishing, because a maximum value W of deflection amount of the diaphragm 68 caused by a pressure difference P is not larger than the thickness dimension H of the diaphragm 68, the diaphragm 68 can be polished to a nearly uniform thickness.

Figure 17:
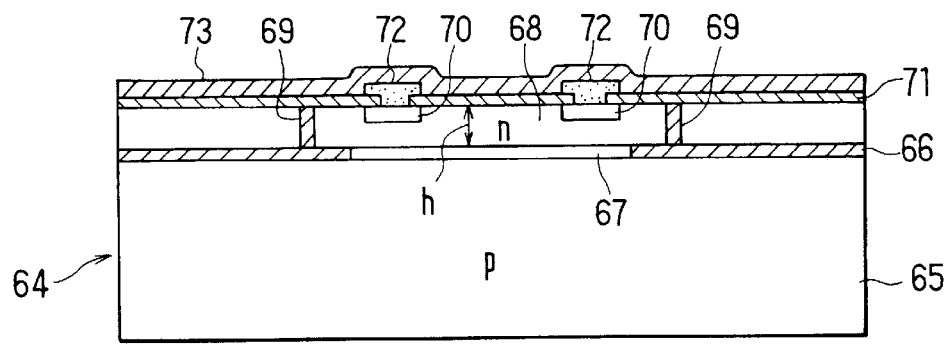
FIG. 17 is a schematic sectional view of a semiconductor pressure sensor substrate according to a fourth preferred embodiment of the invention.

After that, a device forming step is carried out to form devices to be operable as the pressure sensor chip 64. That is, resistors 70 having a piezo resistance effect are formed in the diaphragm 68 by introducing an impurity therein with a known method such as diffusion. Also, in an electrode pad opening forming step, openings are formed in an oxide film 71 by a photolithography process. The openings are formed at positions where bonding pads of aluminum electrodes 72 are to be deposited. As a result, the sensor chip 64 as shown in FIG. 17 can be completed.

According to this preferred embodiment, since the thickness dimension H of the diaphragm 68 is set to satisfy the conditions shown by the equation (D), even in a case where the pressure reference chamber 67 is formed by lamination of the base silicon substrate 65 and the semiconductor substrate 74 in an atmosphere of a vacuum and a polishing step is carried out to the semiconductor substrate 74 to form the diaphragm 68, the deflection amount of the diaphragm 68 can be suppressed in the course of polishing. Therefore, the diaphragm 68 can be processed without any obstacles to device formation and pressure measurement.

Also, in this preferred embodiment, since the pressure reference chamber 67 is formed by the opening 66a provided in the oxide film 66, it is unnecessary to form a concavity used as a pressure reference chamber in a separate step. Therefore, it is possible to simplify the manufacturing process of the pressure sensor chip 64.

The aspect of the invention illustrated in the preferred embodiments described above is not limited to these preferred embodiments, and for example the following variations and extensions are possible.

The degree of deflection of the diaphragm that can be expected to occur in the polishing step does not depend only on the thickness dimension of the diaphragm, and also depends on its area. For example, even when the diaphragm is relatively thick, if its area is large then the amount of deflection caused by a pressure difference across the diaphragm will be large. Therefore, in the invention also, not only in the case of the thickness of the diaphragms 20, 32 shown in the first and second preferred embodiments but also when the diaphragm is made thicker than that thickness, if the area of the diaphragm is large, the useful effects of the invention can be amply obtained.

Although first and second preferred embodiments wherein a monosilicon substrate 13, 28 is used as the first substrate and resistors 21, 33 utilizing a piezoresistance effect are formed in the diaphragm 20, 32 have been described, in cases where a monosilicon substrate is not necessary, a substrate based on polycrystalline or amorphous silicon may be used, or a substrate made of a material other than silicon can be used.

Although a base silicon substrate 15, 30 was used as the second substrate, this does not have to be a monosilicon substrate and for example a substrate made of a rigid ceramic or the like which is capable of being laminated to the first substrate can also be used.

In the second preferred embodiment, to evacuate the inside of the pressure reference chamber 31, oxygen inside the pressure reference chamber 31 was consumed and an oxide film 31a was formed; however, the invention is not limited to this, and for example the laminating step may be carried out with the inside of the pressure reference chamber filled with nitrogen and the chamber then evacuated by this nitrogen being consumed and a nitride film being formed, or the gas inside the chamber may be consumed by another method to evacuate the chamber.

In the above-mentioned preferred embodiments, the shape of the diaphragm was a square, a side of which is a length L. However, unless the manufacturing process becomes complicated, and as long as there is no restriction on signal processing to a measured result or on the structure of the diaphragm, the shape of the diaphragm may be a rectangle or a circle, not limited to a square. That is, since the diaphragm is formed above the pressure reference chamber, the shape of the diaphragm has a close relation to the plan shape of the pressure reference chamber. Therefore, if there is no problem in the process for forming the pressure reference chamber, the diaphragm having a shape of rectangle or circle can be adopted. However, when a concavity for forming the pressure reference chamber is not formed as in the fourth preferred embodiment, it is easy to form a diaphragm having a shape of rectangle or circle.

When the shape of the diaphragm is made circle, the condition equations explained in the third and fourth preferred embodiments are modified as follows.

First, when the plan shape of the diaphragm is a circle having a radius R, the formula (A) is the same as explained before except for the value of α.

$$W=\alpha \times (P \times R^4)/(E \times H^3) \qquad (A')$$

In this case, because the value of α is given as 0.171, the formula (B) can be expressed as follows.

$$W=0.171 \times (P \times R^4)/(E \times H^3) \qquad (B')$$

In view of conditions that the maximum value of the deflection amount W is smaller than the thickness dimension H of the diaphragm, the following condition equation (C') can be obtained.

$$W=0.171 \times (P \times R^4)/(E \times H^3) < H \qquad (C')$$

When the specific values of the pressure P and elastic modulus E are substituted in the condition equation (C'), a condition with respect to a ratio of the radius R to the thickness dimension H in the diaphragm can be obtained as follows.

$$(R/H) < 56 \qquad (D')$$

In other words, when the thickness dimension H of the diaphragm is set against the radius R thereof so as to satisfy the condition equation (D'), the maximum value of the deflection amount W can be limited below the thickness dimension H.

(Fifth Preferred Embodiment)

A fifth preferred embodiment of the invention will now be described with reference to FIGS. 19A to 19H. First, a semiconductor pressure sensor substrate 111 obtained by the manufacturing method of this preferred embodiment, as shown in FIG. 19H, has an active layer 113 for device formation consisting of monocrystalline silicon on a supporting substrate (second supporting substrate) 112 consisting of a for example P-type silicon substrate (silicon wafer) with an insulating film 112a consisting of a silicon oxide film interposed therebetween.

A thin diaphragm 114 is provided in the surface side of the active layer 113, and on the inner side of that a sealed pressure reference chamber 115 having been brought to a near-vacuum is provided. Also, in the surface of the active layer 113, a plurality of piezoelectric resistors 116 positioned at the surface of the diaphragm 114 are formed. An integrated circuit 117 for signal processing is formed to one side of the diaphragm 114. In this preferred embodiment, the thickness of the active layer 113 is for example 15 μm, and the thickness of the diaphragm 114 is for example 2 μm.

A method for manufacturing this semiconductor pressure sensor substrate 111 will now be described. FIGS. 19A to 19H schematically illustrate steps of a process for manufacturing a semiconductor pressure sensor substrate 111 pertaining to this preferred embodiment.

Figure 19A:
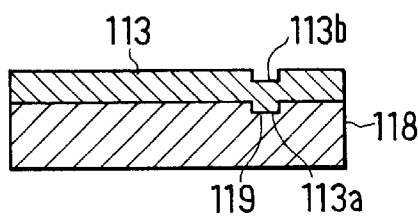
FIGS. 19A to 19H are schematic sectional views of a semiconductor pressure sensor substrate in different steps of a manufacturing process according to a fifth preferred embodiment of the invention.
Figure 19F:
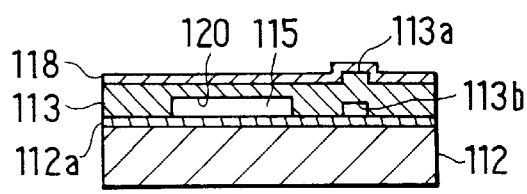

First, as shown in FIG. 19A, a step of forming an active layer 113 consisting of monocrystalline silicon on a first supporting substrate 118 consisting of P-type silicon substrate by N-type epitaxial growth is carried out. By the active layer 113 being formed to a predetermined thickness (for example 15 μm), the active layer 113 constituting a PN junction with the first supporting substrate 118 is obtained on the first supporting substrate 118. At this time, the plane orientation of the active layer 113 may be (100) or (110), but considering the characteristics of anisotropic etching to be carried out later in forming a concavity it is advantageous for the plane orientation to be made (100).

At this time, an alignment mark 119 is formed in advance in a predetermined position on the first supporting substrate 118. Because the active layer 113 is formed on the upper face of the first supporting substrate 118 to a uniform thickness, a projecting mark 113a is formed in the junction face (in the figures, the lower face) of the active layer 113 and a correspondingly recessed concave mark 113b is formed in its surface part (in the figures, its upper face). As will be further discussed later, the projecting mark 113a and the concave mark 113b function as alignment marks.

Figure 19B:
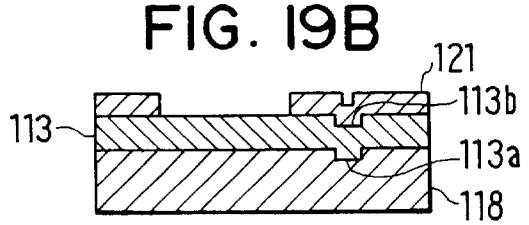
Figure 19G:
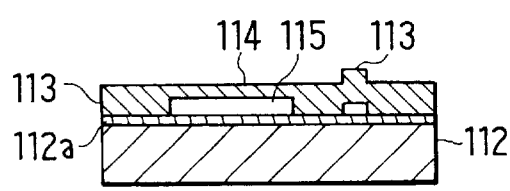

Next, a concavity forming step of forming a concavity 120 to become a pressure reference chamber 115 in the surface of the active layer 113 on the first supporting substrate 118 by etching is carried out. In this concavity forming step, first, as shown in FIG. 19B, a mask (for example a SiN film) is deposited on the surface of the active layer 113 and patterned to form a mask 121 having an opening over a part to be etched (the concavity formation region). At this time, the concavity formation position is determined on the basis of the concave mark 113b formed in the surface of the active layer 113.

Figure 19C:
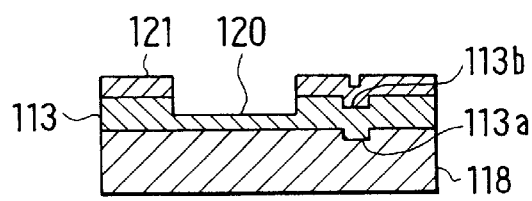
Figure 19H:
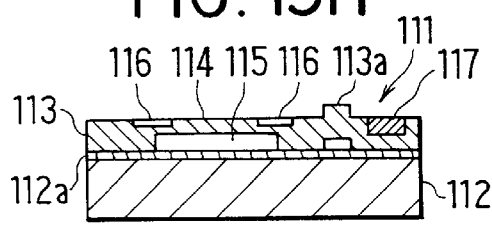
Figure 19D:
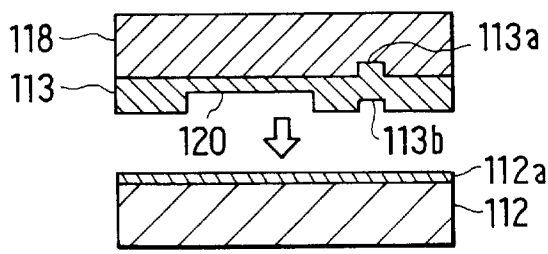

Then, as shown in FIG. 19C, for example by wet etching, a concavity 120 is formed in the active layer 113. In this case, an alkali etching liquid such as KOH having a large etching selectivity with respect to the mask 121 is used. Or, when there is a risk of contamination of surface circuits or manufacturing apparatus, TMAH or the like may be used as the etching liquid. When with respect to the thickness 15am of the active layer 113 the thickness of the diaphragm 114 is to be 2 μm, this concavity 120 is formed to a depth of 13 μm. In this way, the concavity 120 is formed in the active layer 113 with a layer of a thickness corresponding to the diaphragm 114 secured at its bottom. After the concavity 120 is formed, the mask 121 is removed (FIG. 19D).

Then, a laminating step of laminating a second supporting substrate 112 to the active layer 113 is carried out. In this step, as shown in FIG. 19D, the first supporting substrate 118 and the active layer 113 are inverted from the state shown in FIG. 19C and then are laminated to the surface of a second supporting substrate 112 on which an insulating film 112a (a silicon oxide film) has been formed in advance. This lamination is carried out in a vacuum, and the substrates thus laminated together are then heated to a high temperature of 800 to 1100° C.

As is generally known, in another method (not shown) for carrying out this lamination, a pretreatment of successively washing the surface of the second supporting substrate 112 and the surface of the active layer 113 with for example a 4:1 mixture of sulfuric acid and hydrogen peroxide water and then with pure water and thereby forming an extremely thin film of water on those surfaces is carried out. By the surfaces then being brought into intimate contact with each other, silanol radicals are formed on the lamination faces. Then, by heating, a reaction wherein water molecules are removed from the silanol radicals on the surface of the second supporting substrate 112 and the surface of the active layer 113 is made to take place, and siloxane bonding occurs and adheres the two together.

Figure 19E:
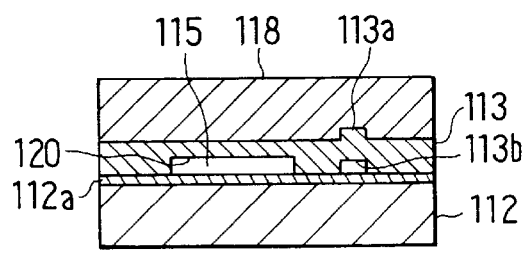

In this way, as shown in FIG. 19E, the active layer 113 and the first supporting substrate 118 are laminated to the upper face of the second supporting substrate 112 in a stack state inverted from that in which they are shown in FIG. 19C. At this time, the opening of the concavity 120 of the active layer 113 is covered by the second supporting substrate 112 and a sealed pressure reference chamber 115 is formed, and the inside of this pressure reference chamber 115 is at a vacuum.

After this lamination, a first substrate removing step of removing most of the first supporting substrate 118 by etching is carried out. This first substrate removing step is carried out using electrochemical stop etching with a depletion layer formed at the PN junction between the first supporting substrate 118 and the active layer 113 as a stopper.

Figure 20:
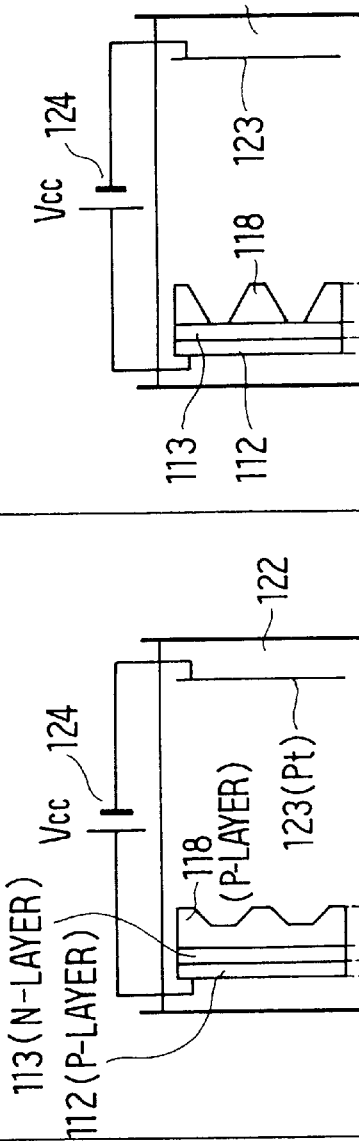
FIG. 20 is a chart explaining the principle of electrochemical stop etching.
Figure 21:
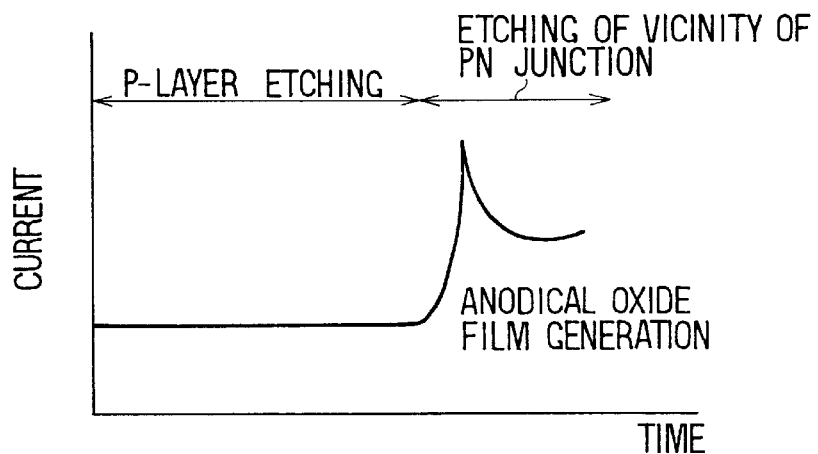
FIG. 21 is a graph showing change in electrical current during electrochemical stop etching.

FIGS. 20, 21 show the principle of this electrochemical stop etching. Electrochemical stop etching is carried out in the following way. First, the substrate of three layers joined as described above is placed in an alkali etching liquid 122 such as KOH. Then, for example a Pt electrode 123 is immersed in the etching liquid 122, and the plus side of a direct current power supply is connected to the second supporting substrate 112, the minus side is connected to the Pt electrode 123, and a voltage Vcc is impressed across the two.

When this is done, a depletion layer opens at the PN junction between the first supporting substrate 118 and the active layer 113, the voltage drop at this depletion layer part becomes large, the potential Vd of the etching face (the surface of the first supporting substrate 118) falls below a predetermined potential Vpp, and Si etching proceeds. At this time, almost no electrical current flows as shown in FIG. 20. When as etching proceeds the etching face reaches the depletion layer (the vicinity of the PN junction), the potential vd of the etching face rises above the predetermined potential Vpp and an electrical current suddenly starts to flow, and the etching face is anodically oxidized and etching is virtually stopped. Thus, as shown in FIG. 19F, only an extremely thin layer corresponding to the depletion layer (for example below 1 μm) is left and most of the first supporting substrate 118 is removed.

When this first supporting substrate removing step is finished, next, a finishing etching step of removing the extremely thin layer corresponding to the depletion layer until the active layer 113 is exposed at the etching face is carried out. In this finishing etching step, etching is carried out by time control on the basis of the etching rate of the etching liquid just to a depth such that the surface of the active layer 113 is exposed. In this way, as shown in FIG. 19G, a semiconductor pressure sensor substrate 111 having a diaphragm 114 of a predetermined thickness and a pressure reference chamber 115 containing a vacuum in an active layer 113 on a second supporting substrate 112 is obtained. And, at this time, the projecting mark 113a remains on the surface of the active layer 113.

Finally, a step of forming piezoelectric resistors 116 and an integrated circuit 117 for signal processing in the surface of the active layer 113 is carried out. This step is carried out by ordinary methods such as photolithography, ion implantation, and diffusion. At this time, the positions in which the piezoelectric resistors 116 and the integrated circuit 117 are formed can be determined on the basis of the projecting mark 113a. In this way, as shown in FIG. 19H, a semiconductor pressure sensor substrate 111 is obtained.

With this preferred embodiment, because the first substrate removing step is carried out by electrochemical stop etching with a depletion layer formed at the junction between the first supporting substrate 118 and the active layer 113 as a stopper, there is no occurrence of the kind of sagging that there is with polishing, and etching can be carried out leaving the part of the first supporting substrate 118 of a uniform thickness on the active layer 113 side. Because in the finishing etching step it is only necessary for extremely shallow etching to remove the remaining part of the first supporting substrate 118 corresponding to the depletion layer to be carried out, any thickness variation resulting from this etching is small enough to be negligible.

Therefore, with this preferred embodiment, unlike manufacturing methods wherein polishing is used to form a diaphragm, it is possible to form a diaphragm 114 of a uniform film thickness having extremely little variation in that thickness. Furthermore, because it is not necessary to form a trench or the like to serve as a stopper, there is the highly valuable benefit that the process is simple and manufacturing costs can be kept low. Also, the thickness of the active layer 113 can be made large irrespective of the thickness of the diaphragm 114, and thus the freedom of design of the integrated circuit 117 is high. Further, positional alignment in the laminating step can be made unnecessary.

In this preferred embodiment, because the active layer 113 is epitaxially grown after an alignment mark 119 is formed in the first supporting substrate 118, a projecting mark 113a and a concave mark 113b can be formed in the active layer 113. These marks can be used for positioning in a concavity forming step and a step of forming piezoelectric resistors 116 and an integrated circuit 117 thereafter. Also, in this preferred embodiment, as a result of the laminating step being carried out in a vacuum, the pressure reference chamber 115 can be brought to a vacuum state easily.

(Sixth Preferred Embodiment)

Figure 22A:
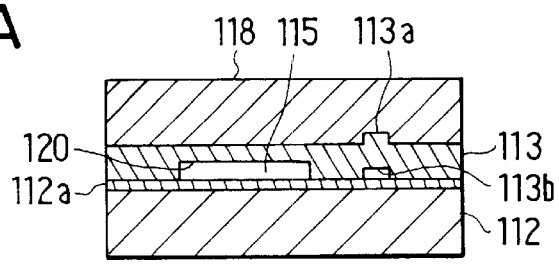
FIGS. 22A to 22C are schematic sectional views showing a semiconductor pressure sensor substrate in a first supporting substrate removing step of a sixth preferred embodiment of the invention.
Figure 22B:
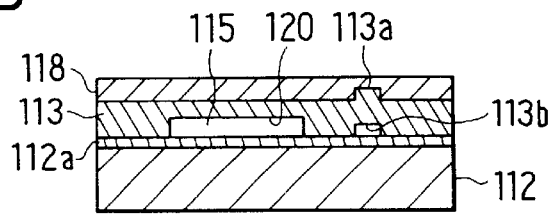
Figure 22C:
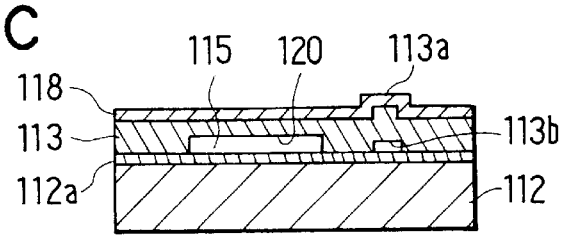
Figure 23A:
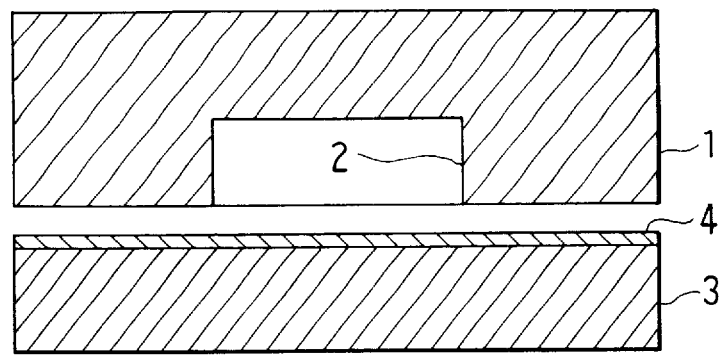
FIGS. 23A to 23C are schematic sectional views of a semiconductor pressure sensor substrate in a related art manufacturing process.
Figure 23B:
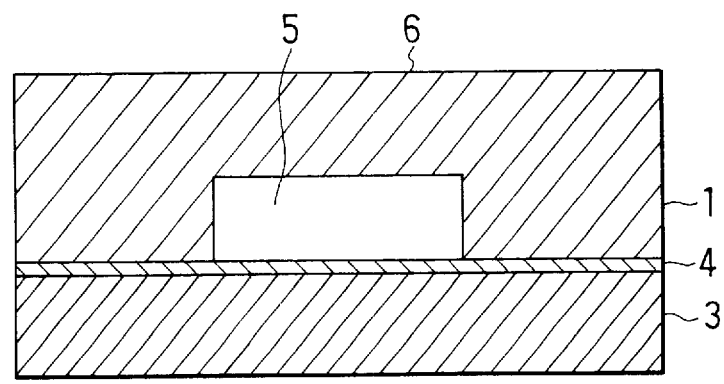
Figure 23C:
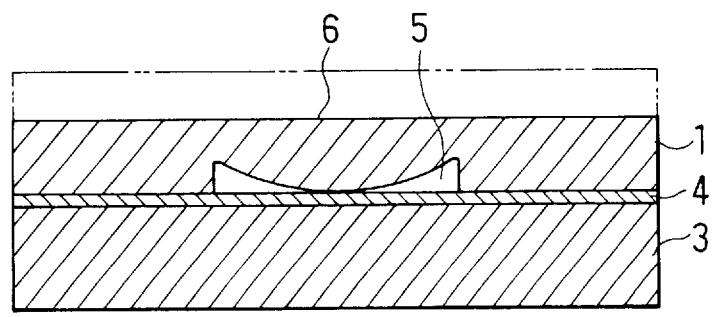

FIGS. 22A to 22C show a sixth preferred embodiment of the invention. The point of difference between this preferred embodiment and the fifth preferred embodiment described above lies in the first substrate removing step. That is, in this preferred embodiment, the first substrate removing step is carried out in two stages, a mechanical polishing stage and an electrochemical stop etching stage.

In this preferred embodiment, the laminating step is carried out in the same way as in the fifth preferred embodiment (see FIG. 22A). Then, a first substrate removing step of removing almost all of the first supporting substrate 118 by etching this substrate of three layers joined is carried out. In this first substrate removing step, in a first stage, the first supporting substrate 118 is partially (for example a thickness of a few hundred μm) removed by polishing (FIG. 22B). This polishing is stopped before sagging occurs in the diaphragm 114.

Then, in the same way as in the third preferred embodiment, electrochemical stop etching is carried out on the remaining part of the first supporting substrate 118 (for example a few μm to a few tens of μm) with the depletion layer formed at the junction between the first supporting substrate 118 and the active layer 113 as a stopper (FIG. 22C). By this means also, because the etching is stopped by the depletion layer, in the same way as in the fifth preferred embodiment, it is possible to form a diaphragm 114 having a uniform thickness. And, in this preferred embodiment, because, as a result of polishing also being used, the amount of material to be removed by the electrochemical stop etching is reduced, the process time can be shortened and cost reductions can be achieved.

The invention is not limited to the preferred embodiments described above, and various changes can be made without deviating from the scope of the invention. For example, the alignment mark formed in the first supporting substrate may be projecting instead of concave, and the invention can also be applied in cases where the pressure reference chamber does not contain a vacuum and is sealed at a predetermined pressure.

What is claimed is:

1. A semiconductor pressure sensor comprising:

a diaphragm which deflects in response to pressure acting on a main surface thereof;

a pressure reference chamber provided on a side of a rear surface of the diaphragm, an inside of the pressure reference chamber being in a state of reduced pressure; and a detecting device for detecting the pressure acting on the main surface of the diaphragm based on an amount of deflection of the diaphragm, wherein, a thickness of the diaphragm is set so that a maximum value of deflection of the diaphragm which is derived from a thickness, a side length, an elastic modulus determined from a material of the diaphragm and a pressure uniformly acting on the main surface of the diaphragm is equal to or lower than the thickness of the diaphragm, and the maximum value W (mm) of deflection of the diaphragm is expressed by the following equation, $$W=0.014 \times (P \times L^4)/(E \times H^3)$$

in which P (kgf/mm$^2$) is a pressure acting on the diaphragm which is determined by a difference between a pressure Po (kgf/mm$^2$) acting on the main surface thereof and a pressure Ps (kgf/mm$^2$) acting on the rear surface thereof, L (mm) is a side length of the diaphragm having a square shape, E (kfg/mm$^2$) is an elastic modulus determined by the material and H is a thickness dimension of the diaphragm.

2. The semiconductor pressure sensor according to claim 1, wherein, the diaphragm is made from monocrystalline silicon, a ratio (L/H) of a side's length L to a thickness H of the diaphragm is set to be smaller than 104.

3. A semiconductor pressure sensor comprising:

a diaphragm which deflects in response to pressure acting on a main surface thereof;

a pressure reference chamber provided on a side of a rear surface of the diaphragm, an inside of the pressure reference chamber being in a state of reduced pressure; and a detecting device for detecting the pressure acting on the main surface of the diaphragm based on an amount of deflection of the diaphragm, wherein, a thickness of the diaphragm is set so that a maximum value of deflection of the diaphragm which is derived from a thickness, a radius, an elastic modulus determined from a material of the diaphragm and a pressure uniformly acting on the main surface of the diaphragm is equal to or lower than the thickness of the diaphragm, and the maximum value W (mm) of deflection of the diaphragm is expressed by the following equation, $$W=0.171 \times (P \times R^4)/(E \times H^3)$$

in which P (kfg/mm$^2$) is a pressure acting on the diaphragm which is determined by a difference between a pressure Po (kgf/mm$^2$) acting on the main surface thereof and a pressure Ps (kgf/mm$^2$) acting on the rear surface thereof, R (mm) is a radius of the diaphragm having a circle shape, E (kfg/mm²) is an elastic modulus determined by the material and H is a thickness dimension of the diaphragm.

4. The semiconductor pressure sensor according to claim 3, wherein, the diaphragm is made from monocrystalline silicon, a ratio (R/H) of a radius R to a thickness H of the diaphragm is set to be smaller than 56.

5. A semiconductor pressure sensor comprising:

a diaphragm which deflects in response to pressure acting on a main surface thereof;

a pressure reference chamber provided on a side of a rear surface of the diaphragm, an inside of the pressure reference chamber being in a state of reduced pressure; and a detecting device for detecting the pressure acting on the main surface of the diaphragm based on an amount of deflection of the diaphragm, wherein, a thickness of the diaphragm is set so that a maximum value of deflection of the diaphragm which is derived from a thickness, a side length, an elastic modulus determined from a material of the diaphragm and a pressure uniformly acting on the main surface of the diaphragm is equal to or lower than the thickness of the diaphragm, and the pressure reference chamber has a channel that extends in parallel with the main surface of the diaphragm, the channel enabling the pressure reference chamber to be sealed at the reduced pressure.

6. A semiconductor pressure sensor comprising:

a diaphragm which deflects in response to pressure acting on a main surface thereof;

a pressure reference chamber provided on a side of a rear surface of the diaphragm, an inside of the pressure reference chamber being in a state of reduced pressure; and a detecting device for detecting the pressure acting on the main surface of the diaphragm based on an amount of deflection of the diaphragm, wherein, a thickness of the diaphragm is set so that a maximum value of deflection of the diaphragm which is derived from a thickness, a side length, an elastic modulus determined from a material of the diaphragm and a pressure uniformly acting on the main surface of the diaphragm is equal to or lower than the thickness of the diaphragm, and the pressure reference chamber has a channel that extends in parallel with the main surface of the diaphragm, the channel being for determining the thickness of the diaphragm in a state where the pressure reference chamber has an atmospheric pressure.

7. A semiconductor pressure sensor comprising:

a diaphragm which deflects in response to pressure acting on a main surface thereof;

a pressure reference chamber provided on a side of a rear surface of the diaphragm, an inside of the pressure reference chamber being in a state of reduced pressure; and a detecting device for detecting the pressure acting on the main surface of the diaphragm based on an amount of deflection of the diaphragm, wherein, a thickness of the diaphragm is set so that a maximum value of deflection of the diaphragm which is derived from a thickness, a radius, an elastic modulus determined from a material of the diaphragm and a pressure uniformly acting on the main surface of the diaphragm is equal to or lower than the thickness of the diaphragm, and the pressure reference chamber has a channel that extends in parallel with the main surface of the diaphragm, the channel enabling the pressure reference chamber to be sealed at the reduced pressure.

8. A semiconductor pressure sensor comprising:

a diaphragm which deflects in response to pressure acting on a main surface thereof;

a pressure reference chamber provided on a side of a rear surface of the diaphragm, an inside of the pressure reference chamber being in a state of reduced pressure; and a detecting device for detecting the pressure acting on the main surface of the diaphragm based on an amount of deflection of the diaphragm, wherein, a thickness of the diaphragm is set so that a maximum value of deflection of the diaphragm which is derived from a thickness, a radius, an elastic modulus determined from a material of the diaphragm and a pressure uniformly acting on the main surface of the diaphragm is equal to or lower than the thickness of the diaphragm, and the pressure reference chamber has a channel that extends in parallel with the main surface of the diaphragm, the channel being for determining the thickness of the diaphragm in a state where the pressure reference chamber has an atmospheric pressure.

* * * * *